United States Patent
Partovi et al.

(10) Patent No.: US 7,681,063 B2
(45) Date of Patent: Mar. 16, 2010

(54) CLOCK DATA RECOVERY CIRCUIT WITH CIRCUIT LOOP DISABLEMENT

(75) Inventors: Hamid Partovi, Sunnyvale, CA (US); Luca Ravezzi, Palo Alto, CA (US); Karthik Gopalakrishnan, San Jose, CA (US); Andreas Blum, Munich (DE); Paul Lindt, Doinauworth (DE)

(73) Assignee: Infineon Technologies AG, Neubiberg (DE)

( * ) Notice: Subject to any disclaimer, the term of this patent is extended or adjusted under 35 U.S.C. 154(b) by 1384 days.

(21) Appl. No.: 11/093,554

(22) Filed: Mar. 30, 2005

(65) Prior Publication Data
US 2006/0227914 A1    Oct. 12, 2006

(51) Int. Cl.
*G06F 11/00* (2006.01)
*H04L 27/00* (2006.01)
*H04L 7/00* (2006.01)

(52) U.S. Cl. .................. 713/503; 375/326; 375/355

(58) Field of Classification Search .................. 713/503
See application file for complete search history.

(56) References Cited

U.S. PATENT DOCUMENTS

| 6,055,225 | A | 4/2000 | Wu |
| 6,526,109 | B1 | 2/2003 | Chang et al. |
| 6,750,675 | B2 | 6/2004 | Venkata et al. |
| 7,020,227 | B1 * | 3/2006 | Wang et al. ................. 375/355 |
| 7,076,377 | B2 * | 7/2006 | Kim et al. ..................... 702/66 |
| 7,099,424 | B1 * | 8/2006 | Chang et al. ................ 375/370 |
| 7,142,623 | B2 * | 11/2006 | Sorna ......................... 375/376 |
| 7,532,697 | B1 * | 5/2009 | Sidiropoulos et al. ....... 375/376 |
| 2006/0140321 | A1 * | 6/2006 | Tell et al. .................... 375/376 |
| 2006/0224339 | A1 * | 10/2006 | Kim et al. ..................... 702/66 |

* cited by examiner

*Primary Examiner*—Suresh K Suryawanshi
(74) *Attorney, Agent, or Firm*—Dicke, Billig & Czaja, P.L.L.C.

(57) ABSTRACT

A clock data recovery circuit includes a first circuit, a second circuit, and a third circuit. The first circuit is configured to receive data and a clock signal and to detect transitions in the data and provide a first signal based on the clock signal and the transitions in the data. The second circuit is configured to receive the first signal and provide a first shift signal based on the first signal. The third circuit is configured to receive the first shift signal, wherein the first circuit, the second circuit, and the third circuit are configured to form a first circuit loop and the third circuit is configured to disable the first circuit loop and shift the clock signal based on the first shift signal.

26 Claims, 6 Drawing Sheets

CLOCK DATA RECOVERY CIRCUIT WITH CIRCUIT LOOP DISABLEMENT

BACKGROUND

As computer processing power continues to increase, memory capacity becomes an issue for future computer and server performance. Memory capacity problems are exacerbated as the speed of memory increases, such as with the development of second generation double data rate dynamic random access memories (DDR2-DRAMs) and third generation double data rate dynamic random access memories (DDR3-DRAMs). With each increase in memory capacity more traces are needed to support increased clock speeds and as memory speeds increase the memory capacity that can be supported decreases due to problems such as noise and cross-talk.

To address these issues, the industry developed a memory interface capable of scaling with the increasing speeds of memory while providing a long term alternative for next generation memory solutions. This architecture has become an industry standard referred to as fully buffered dual in-line memory module (FB-DIMM). An FB-DIMM includes a bi-directional serial interface that simplifies board electrical routing and eliminates the requirement for additional memory controllers. Compared to registered DIMM technology, FB-DIMMs provide larger memory capacities, higher bandwidths, and lower pin counts.

Typically, each FB-DIMM includes an advanced memory buffer (AMB) and a selected number of dynamic random access memories (DRAMs), such as DDR2-DRAMs and DDR3-DRAMs. The AMB is responsible for handling FB-DIMM channel and memory requests to and from the local FB-DIMM and for forwarding the requests to other FB-DIMMs. The AMB receives commands, addresses and write data from a memory controller or via another AMB. The AMB transmits read data to the memory controller directly or via another FB-DIMM. Clock signals and data are recovered from the data by a clock and data recovery circuit (CDR).

The CDR recovers clock signals and data from the data and locks a clock signal to transitions in the data to accurately acquire data for use at the local FB-DIMM or transmission of the data to other FB-DIMMs. Often the phase of the clock signal is locked to the data transitions as quickly as possible. Typically, the incoming data stream is sampled with multiple clock phases to find the nearest clock phase to transitions in the data. Alternatively, the CDR includes an analog dual loop architecture, such as CDRs used in disk drive applications. Each of these methods achieves fast phase convergence at the cost of area and power consumption.

For these and other reasons there is a need for the present invention.

SUMMARY

One aspect of the present invention provides a clock data recovery circuit including a first circuit, a second circuit, and a third circuit. The first circuit is configured to receive data and a clock signal and to detect transitions in the data and provide a first signal based on the clock signal and the transitions in the data. The second circuit is configured to receive the first signal and provide a first shift signal based on the first signal. The third circuit is configured to receive the first shift signal, wherein the first circuit, the second circuit, and the third circuit are configured to form a first circuit loop and the third circuit is configured to disable the first circuit loop and shift the clock signal based on the first shift signal.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "lagging," "left," "right," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
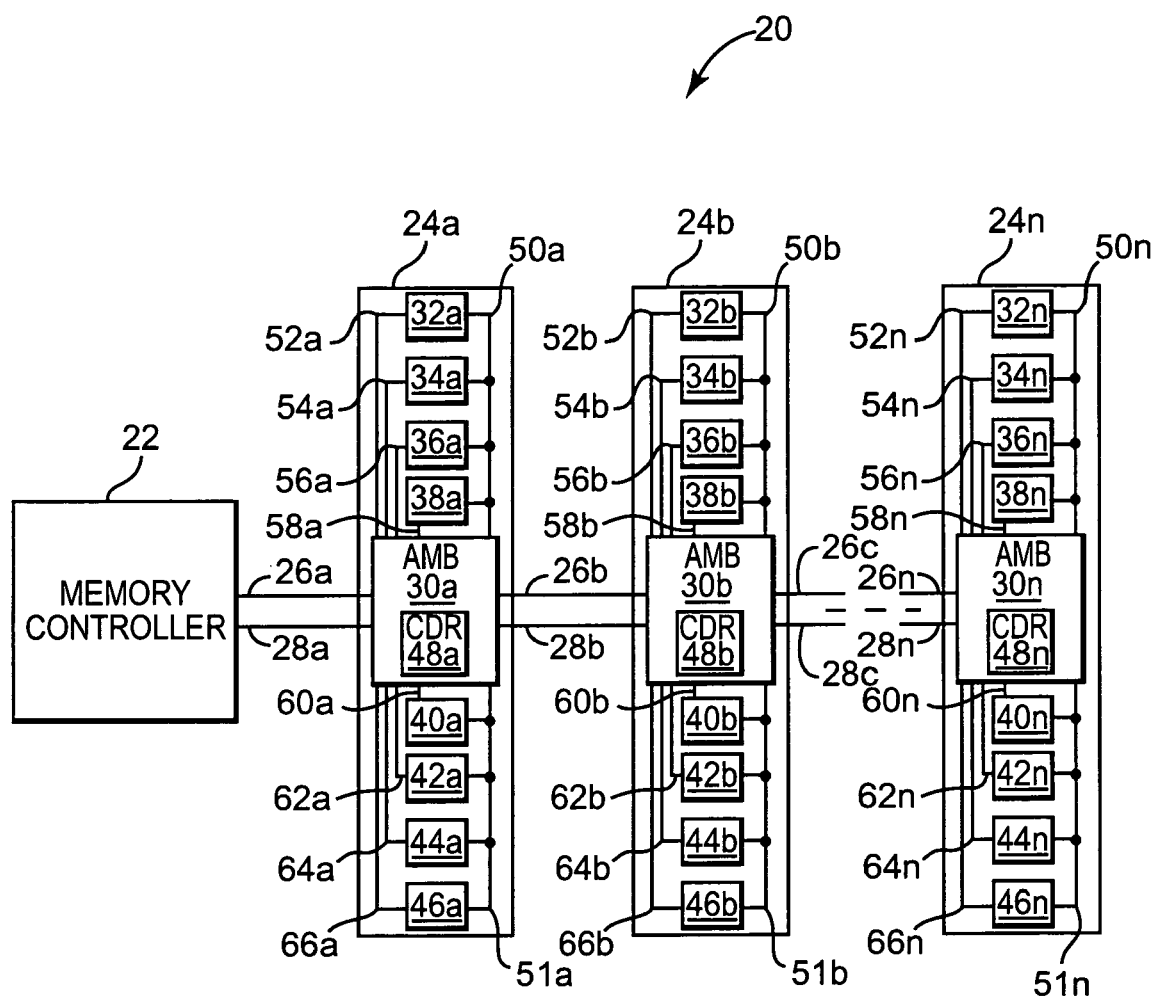
FIG. 1 is a diagram illustrating one embodiment of a computer system according to the present invention.

FIG. 1 is a diagram illustrating one embodiment of a computer system 20 according to the present invention. The computer system 20 includes a memory controller 22 and fully buffered dual in-line memory modules (FB-DIMMs) 24a-24n. Memory controller 22 is electrically coupled to FB-DIMM 24a via command communications path 26a and read communications path 28a. FB-DIMM 24a is electrically coupled to FB-DIMM 24b via command communications path 26b and read communications path 28b. FB-DIMM 24b is electrically coupled to the next FB-DIMM 24c (not shown) via command communications path 26c and read communications path 28c, and so on, up to FB-DIMM 24n-1 (not shown) being electrically coupled to FB-DIMM 24n via command communications path 26n and read communications path 28n.

In one embodiment, each of the command communications paths 26a-26n includes 20 traces organized as ten differential signal pairs. In one embodiment, each of the read communications paths 28a-28n includes twenty eight traces organized as fourteen differential signal pairs. In other embodiments, command communications paths 26a-26n and read communications paths 28a-28n include any suitable number of traces organized in any suitable communication scheme.

Memory controller 22 is configured to transmit commands, addresses, and write data to FB-DIMM 24a via command communications path 26a. FB-DIMM 24a can consume the commands, addresses, and write data locally or transmit the commands, addresses, and write data to FB-DIMM 24b via command communications path 26b. FB-DIMM 24b can consume the commands, addresses, and write data locally or transmit the commands, addresses, and write data to the next FB-DIMM via command communications path 26c. The commands, addresses, and write data are serially transmitted from one FB-DIMM to the next FB-DIMM, up to and including being transmitted to FB-DIMM 24n via communications path 26n.

Read data is transmitted from an originating FB-DIMM 24a-24n to the previous FB-DIMM 24a-24n and out to memory controller 22. FB-DIMM 24n transmits read data to FB-DIMM 24n-1 via read communications path 28n, and so on up to FB-DIMM 24c that transmits read data to FB-DIMM 24b via read communications path 28c. FB-DIMM 24b transmits read data to FB-DIMM 24a via read communications path 28b and FB-DIMM 24a transmits read data to memory controller 22 via read communications path 28a.

FB-DIMM 24a includes an advanced memory buffer (AMB) 30a and dynamic random access memories (DRAMs) 32a, 34a, 36a, 38a, 40a, 42a, 44a, and 46a. AMB 30a is electrically coupled to memory controller 22 via command communications path 26a and read communications path 28a. AMB 30a includes a clock and data recovery circuit (CDR) 48a. In one embodiment, each of the DRAMs 32a, 34a, 36a, 38a, 40a, 42a, 44a, and 46a is a second generation double data rate DRAM (DDR2-DRAM). In one embodiment, each of the DRAMs 32a, 34a, 36a, 38a, 40a, 42a, 44a, and 46a is a third generation double data rate DRAM (DDR3-DRAM). In other embodiments, each of the DRAMs 32a, 34a, 36a, 38a, 40a, 42a, 44a, and 46a can be any suitable memory.

Each of the DRAMs 32a, 34a, 36a, 38a, is electrically coupled to AMB 30a via address path 50a and each of the DRAMs 40a, 42a, 44a, and 46a is electrically coupled to AMB 30a via address path 51a. Also, each of the DRAMs 32a, 34a, 36a, 38a, 40a, 42a, 44a, and 46a is electrically coupled to one of the data paths 52a, 54a, 56a, 58a, 60a, 62a, 64a, and 66a. DRAM 32a is electrically coupled to AMB 30a via data path 52a. DRAM 34a is electrically coupled to AMB 30a via data path 54a. DRAM 36a is electrically coupled to AMB 30a via data path 56a. DRAM 38a is electrically coupled to AMB 30a via data path 58a. DRAM 40a is electrically coupled to AMB 30a via data path 60a. DRAM 42a is electrically coupled to AMB 30a via data path 62a. DRAM 44a is electrically coupled to AMB 30a via data path 64a. DRAM 46a is electrically coupled to AMB 30a via data path 66a.

FB-DIMM 24b includes AMB 30b and DRAMs 32b, 34b, 36b, 38b, 40b, 42b, 44b, and 46b. AMB 30b is electrically coupled to AMB 30a via command communications path 26b and read communications path 28b. Also, AMB 30b includes CDR 48b. In one embodiment, each of the DRAMs 32b, 34b, 36b, 38b, 40b, 42b, 44b, and 46b is a DDR2-DRAM. In one embodiment, each of the DRAMs 32b, 34b, 36b, 38b, 40b, 42b, 44b, and 46b is a DDR3-DRAM. In other embodiments, each of the DRAMs 32b, 34b, 36b, 38b, 40b, 42b, 44b, and 46b can be any suitable memory.

Each of the DRAMs 32b, 34b, 36b, and 38b is electrically coupled to AMB 30b via address path 50b and each of the DRAMs 40b, 42b, 44b, and 46b is electrically coupled to AMB 30b via address path 51b. Also, each of the DRAMs 32b, 34b, 36b, 38b, 40b, 42b, 44b, and 46b is electrically coupled to one of the data paths 52b, 54b, 56b, 58b, 60b, 62b, 64b, and 66b. DRAM 32b is electrically coupled to AMB 30b via data path 52b. DRAM 34b is electrically coupled to AMB 30b via data path 54b. DRAM 36b is electrically coupled to AMB 30b via data path 56b. DRAM 38b is electrically coupled to AMB 30b via data path 58b. DRAM 40b is electrically coupled to AMB 30b via data path 60b. DRAM 42b is electrically coupled to AMB 30b via data path 62b. DRAM 44b is electrically coupled to AMB 30b via data path 64b. DRAM 46b is electrically coupled to AMB 30b via data path 66b.

Each of the other FB-DIMMs 24c-24n-1 (not shown) is similar to FB-DIMM 24b. FB-DIMM 24n includes AMB 30n and DRAMs 32n, 34n, 36n, 38n, 40n, 42n, 44n, and 46n. AMB 30n is electrically coupled to AMB 30n-1 (not shown) via command communications path 26n and read communications path 28n. Also, AMB 30n includes CDR 48n. In one embodiment, each of the DRAMs 32n, 34n, 36n, 38n, 40n, 42n, 44n, and 46n is a DDR2-DRAM. In one embodiment, each of the DRAMs 32n, 34n, 36n, 38n, 40n, 42n, 44n, and 46n is a DDR3-DRAM. In other embodiments, each of the DRAMs 32n, 34n, 36n, 38n, 40n, 42n, 44n, and 46n can be any suitable memory.

Each of the DRAMs 32n, 34n, 36n, and 38n is electrically coupled to AMB 30n via address path 50n and each of the DRAMs 40n, 42n, 44n, and 46n is electrically coupled to AMB 30n via address path 51n. Also, each of the DRAMs 32n, 34n, 36n, 38n, 40n, 42n, 44n, and 46n is electrically coupled to one of the data paths 52n, 54n, 56n, 58n, 60n, 62n, 64n, and 66n. DRAM 32n is electrically coupled to AMB 30n via data path 52n. DRAM 34n is electrically coupled to AMB 30n via data path 54n. DRAM 36n is electrically coupled to AMB 30n via data path 56n. DRAM 38n is electrically coupled to AMB 30n via data path 58n. DRAM 40n is electrically coupled to AMB 30n via data path 60n. DRAM 42n is electrically coupled to AMB 30n via data path 62n. DRAM 44n is electrically coupled to AMB 30n via data path 64n. DRAM 46n is electrically coupled to AMB 30n via data path 66n.

Memory controller 22 controls read and write accesses to FB-DIMMs 24a-24n. AMB 30a receives commands, addresses, and write data from memory controller 22 via command communications path 26a. To consume the commands, addresses, and write data locally, AMB 30a transmits the addresses to DRAMs 32a, 34a, 36a, 38a, 40a, 42a, 44a, and 46a via address paths 50a and 51a. Also, AMB 30a transmits the data to DRAMs 32a, 34a, 36a, 38a, 40a, 42a, 44a, and 46a via the corresponding data paths 52a, 54a, 56a, 58a, 60a, 62a, 64a, and 66a. To pass the commands, addresses, and write data to another FB-DIMM, AMB 30a transmits the commands, addresses, and write data to AMB 30b in FB-DIMM 24b via command communications path 26b.

To consume the commands, addresses, and write data locally, AMB 30b transmits the addresses to DRAMs 32b, 34b, 36b, 38b, 40b, 42b, 44b, and 46b via address paths 50b and 51b. Also, AMB 30b transmits the data to DRAMs 32b, 34b, 36b, 38b, 40b, 42b, 44b, and 46b via corresponding data paths 52b, 54b, 56b, 58b, 60b, 62b, 64b, and 66b. To pass the commands, addresses, and write data to another FB-DIMM, AMB 30b transmits the commands, addresses, and write data to the AMB in FB-DIMM 24c via command communications path 26c.

The commands, addresses, and write data can be serially transmitted from one AMB to the next AMB, up to and including being transmitted to AMB 30n in FB-DIMM 24n via communications path 26n. To consume the commands, addresses, and write data locally, AMB 30n transmits the addresses to DRAMs 32n, 34n, 36n, 38n, 40n, 42n, 44n, and 46n via address paths 50n and 51n. Also, AMB 30n transmits the data to DRAMs 32n, 34n, 36n, 38n, 40n, 42n, 44n, and 46n via corresponding data paths 52n, 54n, 56n, 58n, 60n, 62n, 64n, and 66n.

Read data is transmitted from an originating FB-DIMM 24a-24n to the previous FB-DIMM 24a-24n and out to memory controller 22. AMB 30n in FB-DIMM 24n transmits read data to AMB 30n-1 in FB-DIMM 24n-1 (not shown) via read communications path 28n, and so on, up to AMB 30c in FB-DIMM 24c (not shown) that transmits read data to AMB 30b in FB-DIMM 24b via read communications path 28c. AMB 30b transmits read data to AMB 30a in FB-DIMM 24a via read communications path 28b and AMB 30a transmits the read data to memory controller 22 via read communications path 28a.

CDRs 48a-48n in AMBs 30a-30n receive data and recover the data and a clock signal from the data. The CDRs 48a-48n receive data from one of the AMBs 30a-30n or memory controller 22. Recovered data may be consumed locally and/or transmitted to one of the AMBs 30a-30n or memory controller 22. In one embodiment, each differential data path in command communications paths 26a-26n and read communications paths 28a-28n includes a CDR, such as one of the CDRs 48a-48n.

If CDR 48a is connected to a data path in command communications path 26a, CDR 48a receives write data from memory controller 22 and recovers the write data and a clock signal from the write data. If the write data is consumed locally, AMB 30a transmits the recovered write data and the recovered clock signal or a derivative of the recovered clock signal to addressed DRAMs 32a, 34a, 36a, 38a, 40a, 42a, 44a, and 46a. The write data is written into the addressed memory locations. If the write data is not consumed locally, AMB 30a transmits the recovered write data to AMB 30b via command communications path 26b. If CDR 48a is connected to a data path in read communications path 28b, CDR 48a receives read data from AMB 30b and recovers the read data and a clock signal from the read data. The recovered read data is transmitted to memory controller 22 via read communications path 28a.

If CDR 48b is connected to a data path in command communications path 26b, CDR 48b receives write data from AMB 30a and recovers the write data and a clock signal from the write data. If the write data is consumed locally, AMB 30b transmits the recovered write data and the recovered clock signal or a derivative of the recovered clock signal to addressed DRAMs 32b, 34b, 36b, 38b, 40b, 42b, 44b, and 46b. The write data is written into the addressed memory locations. If the write data is not consumed locally, AMB 30b transmits the recovered write data to AMB 30c via command communications path 26c. If CDR 48b is connected to a data path in read communications path 28c, CDR 48b receives read data from AMB 30c and recovers the read data and a clock signal from the read data. The recovered read data is transmitted to AMB 30a via read communications path 28b. CDRs 48c-48n-1 (not shown) operate similar to CDR 48b.

If CDR 48n is connected to a data path in command communications path 26n, CDR 48n receives write data from AMB 30n-1 and recovers the write data and a clock signal from the write data. If the write data is consumed locally, AMB 30n transmits the recovered write data and the recovered clock signal or a derivative of the recovered clock signal to addressed DRAMs 32n, 34n, 36n, 38n, 40n, 42n, 44n, and 46n. The recovered write data is written into the addressed memory locations.

In one example operation, each of the CDRs 48a-48n is connected to a data path in one of the command communications paths 26a-26n. Memory controller 22 transmits a write command, write address, and write data to AMB 30a. The write address indicates one or more memory locations in FB-DIMM 24b. AMB 30a receives the write command, write address, and write data and CDR 48a receives one of the write data streams. CDR 48a locks onto the write data and recovers the write data and a clock signal from the write data. Since the write address indicates one or more memory locations in FB-DIMM 24b, AMB 30a transmits the recovered write data, the write command, and the write address to AMB 30b. CDR 48b receives one of the write data streams and recovers the write data and a clock signal from the write data. Since the write address indicates memory locations in FB-DIMM 24b, AMB 30b transmits the recovered write data and the recovered clock signal to DRAMs 32b, 34b, 36b, 38b, 40b, 42b, 44b, and 46b. The write data is written into addressed memory locations.

Figure 2:
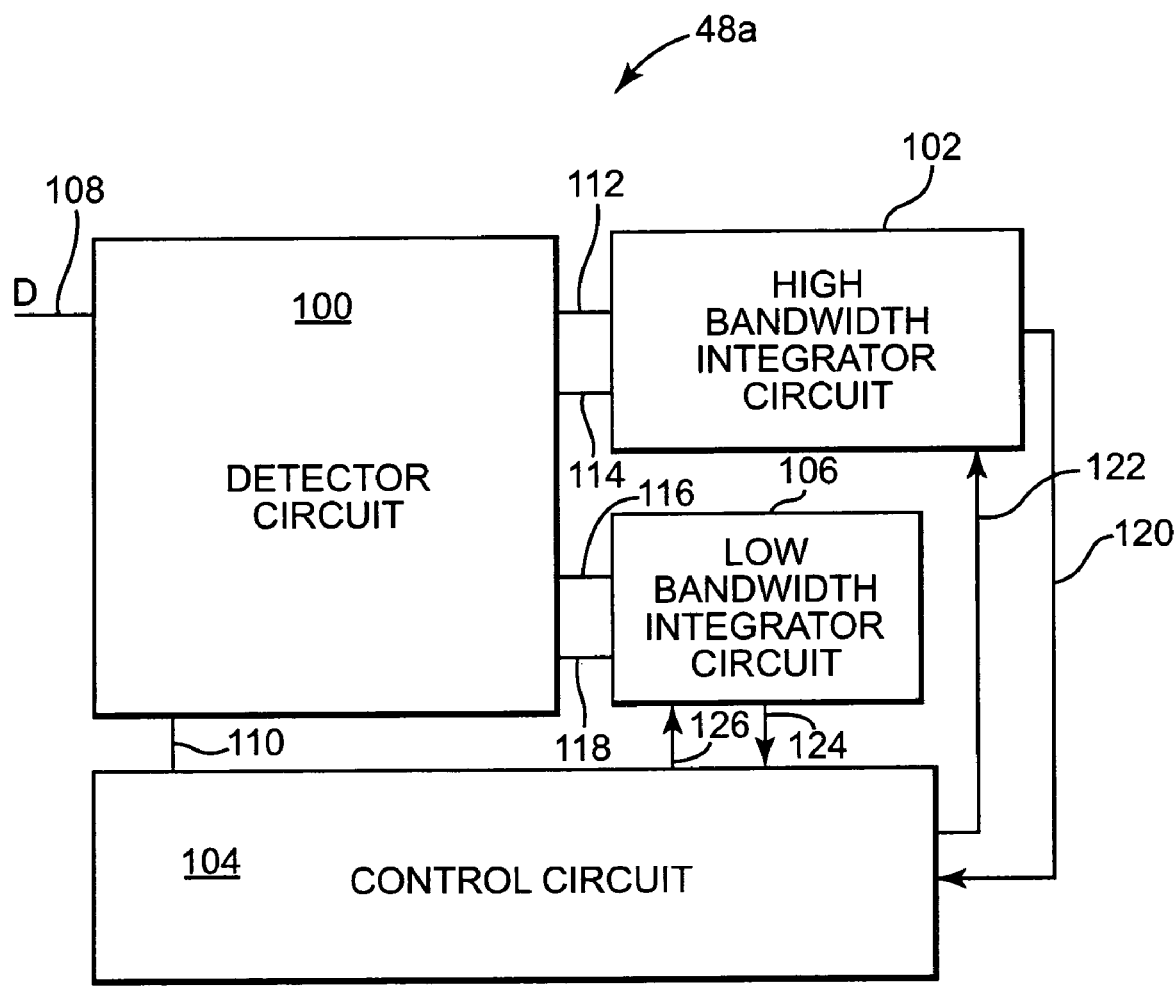
FIG. 2 is a diagram illustrating one embodiment of a CDR.

FIG. 2 is a diagram illustrating one embodiment of a CDR 48a. Each of the CDR's 48b-48n in computer system 20 of FIG. 1 is similar to CDR 48a. In other embodiments, one or more of the CDR's 48a-48n can be similar to another suitable CDR.

CDR 48a includes a detector circuit 100, a high bandwidth integrator circuit 102, a control circuit 104, and a low bandwidth integrator circuit 106. Detector circuit 100 receives data D at 108 and is electrically coupled to control circuit 104 via clock signal communications path 110. Also, detector circuit 100 is electrically coupled to high bandwidth integrator circuit 102 via leading communications path 112 and lagging communications path 114 and to low bandwidth integrator circuit 106 via leading communications path 116 and lagging communications path 118. High bandwidth integrator circuit 102 is electrically coupled to control circuit 104 via shift communications path 120 and reset communications path 122. Low bandwidth integrator circuit 106 is electrically coupled to control circuit 104 via shift communications path 124 and reset communications path 126. Control circuit 104 is electrically coupled to detector circuit 100 via clock signal communications path 110.

Detector circuit 100 receives data D at 108 and quadrature clock signals from control circuit 104 via clock signal communications path 110. The quadrature clock signals include four clock signals. Each of the four clock signals has a 50% duty cycle and each of the four clock signals oscillates at the same frequency as the other quadrature clock signals. The first of the four clock signals leads the second of the four clock signals by 90 degrees. The second of the four clock signals leads the third of the four clock signals by 90 degrees. The third of the four clock signals leads the fourth of the four clock signals by 90 degrees, and the fourth of the four clock signals leads the first of the four clock signals by 90 degrees. Data D at 108 transitions at a data rate such that data D at 108 transitions at 180 degree intervals with respect to each of the four clock signals. That is, each of the four clock signals oscillates at one half the data rate. In one embodiment, the data rate is 5 gigabits per second (Gbps) and the data eye is 200 picoseconds (ps), and each of the four clock signals oscillates at 2.5 gigahertz (GHz) with a period of 400 ps.

Detector circuit 100 detects transitions in data D at 108 between rising edges of the quadrature clock signals. The rising edge of the first (and the third) of the four clock signals either leads transitions in data D at 108 by up to 90 degrees or lags transitions in data D at 108 by up to 90 degrees or is in phase with transitions in data D at 108. For clarity herein, only the rising edge of the first of the four clock signals may be described as either leading or lagging transitions in data D at 108. However, in the illustrated embodiment, the rising edges of the first and the third of the four clock signals either leads or lags transitions in data D at 108 by up to 90 degrees. Also, for clarity herein, only the rising edge of the second of the four clock signals may be described as being aligned near the center of the data eye. However, in the illustrated embodiment, the rising edges of the second and the fourth of the four clock signals are aligned near the center of the data eye.

Detector circuit 100 indicates whether the rising edge of the first of the four clock signals leads or lags transitions in data D at 108. If the rising edge of the first of the four clock signals leads transitions in data D at 108 by up to 90 degrees, detector circuit 100 provides a leading indicator. If the rising edge of the first of the four clock signals lags transitions in data D at 108 by up to 90 degrees, detector circuit 100 provides a lagging indicator.

Detector circuit 100 provides leading indicators to high bandwidth integrator circuit 102 via leading communications path 112 and lagging indicators to high bandwidth integrator circuit 102 via lagging communications path 114. Detector circuit 100 provides leading indicators to low bandwidth integrator circuit 106 via leading communications path 116 and lagging indicators to low bandwidth integrator circuit 106 via lagging communications path 118. In one embodiment, leading and lagging indicators provided to high bandwidth integrator circuit 102 are provided at the data rate of data D at 108. In one embodiment, leading and lagging indicators provided to low bandwidth integrator circuit 106 are provided at the data rate of data D at 108. In one embodiment, leading and lagging indicators are decimated and provided to low bandwidth integrator circuit 106 at a fraction of the data rate of data D at 108. In other embodiments, leading and lagging indicators are provided to high bandwidth integrator circuit 102 and low bandwidth integrator circuit 106 at any suitable rate.

High bandwidth integrator circuit 102 integrates (i.e., accumulates) leading indicators and lagging indicators and provides a high speed shift signal to control circuit 104. High bandwidth integrator circuit 102 receives leading indicators via leading communications path 112 and lagging indicators via lagging communications path 114. High bandwidth integrator circuit 102 accumulates leading indicators and lagging indicators in separate accumulators. If a number of leading indicators, such as eight leading indicators, is accumulated, high bandwidth integrator circuit 102 dumps a high speed shift signal to control circuit 104 to shift quadrature clocks to the right in relation to transitions in data D at 108. If a number of lagging indicators, such as eight lagging indicators, is accumulated, high bandwidth integrator circuit 102 dumps a high speed shift signal to control circuit 104 to shift quadrature clocks to the left in relation to transitions in data D at 108. The high speed shift signal indicates whether the rising edge of the first one of the quadrature clock signals predominately leads or lags transitions in data D at 108 and to shift the quadrature clock signals to the right or to the left to align the rising edge of the first one of the quadrature clock signals more closely with transitions in data D at 108. In one embodiment, high bandwidth integrator circuit 102 receives leading indicators and lagging indicators at the data rate of data D at 108.

In other embodiments, high bandwidth integrator circuit 102 accumulates leading indicators and lagging indicators in any suitable integrator, such as an integrator that accumulates leading indicators and lagging indicators in a central addition/subtraction type accumulator, wherein leading indicators are added and lagging indicators are subtracted. If a positive number, such as eight, is accumulated, high bandwidth integrator circuit 102 dumps a high speed shift signal to control circuit 104 to shift quadrature clocks to the right in relation to transitions in data D at 108. If a negative number, such as negative eight, is accumulated, high bandwidth integrator circuit 102 dumps a high speed shift signal to control circuit 104 to shift quadrature clocks to the left in relation to transitions in data D at 108. If the positive or negative number is not accumulated in a selected time interval, a timeout occurs and high bandwidth integrator circuit 102 dumps a high speed shift signal to control circuit 104 to shift quadrature clocks to the right or left based on whether the count in the accumulator is positive or negative. The high speed shift signal indicates whether the first one of the quadrature clock signals predominately leads or lags transitions in data D at 108 and to shift the quadrature clock signals to the right or to the left to align the rising edge of the first one of the quadrature clock signals more closely with transitions in data D at 108.

Low bandwidth integrator circuit 106 integrates (i.e., accumulates) leading indicators and lagging indicators and provides a low speed shift signal to control circuit 104. Low bandwidth integrator circuit 106 accumulates leading and lagging indicators to track and fine tune the rising edge of the first one of the quadrature clock signals more closely with transitions in data D at 108. After the initial coarse lock has occurred, low bandwidth integrator circuit 106 receives leading indicators via leading communications path 116 and lagging indicators via lagging communications path 118. Low bandwidth integrator circuit 106 can accumulate leading indicators and lagging indicators in any suitable integrator, such as an integrator that accumulates leading indicators and lagging indicators in separate accumulators or an integrator that accumulates leading indicators and lagging indicators in a central addition/subtraction type accumulator. If a selected number of leading indicators is accumulated, low bandwidth integrator circuit 106 dumps a low speed shift signal to control circuit 104 to shift quadrature clocks to the right in relation to transitions in data D at 108. If a selected number of lagging indicators is accumulated, low bandwidth integrator circuit 106 dumps a low speed shift signal to control circuit 104 to shift quadrature clocks to the left in relation to transitions in data D at 108. The low speed shift signal indicates whether the rising edge of the first one of the quadrature clock signals is leading or lagging transitions in the data D at 108 and to shift the quadrature clock signals to the right or to the left to align the rising edge of the first one of the quadrature clock signals more closely with transitions in data D at 108.

In one embodiment, low bandwidth integrator circuit 106 receives leading indicators and lagging indicators at the data rate of data D at 108 and accumulates a larger number of leading indicators and lagging indicators, as compared to high bandwidth integrator 102, prior to dumping a low speed shift signal to control circuit 104. In one embodiment, leading indicators and lagging indicators from detector circuit 100 are decimated or divided down to indicate leading and lagging transitions at a fraction of the data rate D at 108. Low bandwidth integrator circuit 106 receives the decimated leading indicators and lagging indicators and accumulates a certain number prior to dumping a low speed shift signal to control circuit 104. In other embodiments, detector circuit 100 and low bandwidth integrator circuit 106 provide a combination of decimated leading and lagging indicators and accumulating a larger number of leading and lagging indicators prior to dumping the low speed shift signal. In other embodiments, any suitable scheme can be used to provide a low speed shift signal to control circuit 104.

Control circuit 104, also referred to as a phase shift circuit, receives the high speed shift signal from high bandwidth integrator 102 via shift communications path 120 and transmits a reset signal to high bandwidth integrator circuit 102 via reset communications path 122. Control circuit 104 resets high bandwidth integrator circuit 102 via the reset signal to prevent high bandwidth integrator circuit 102 from providing another high speed shift signal while control circuit 104 shifts the quadrature clock signals. High bandwidth integrator circuit 102 provides another high speed shift signal after the reset is released or after high bandwidth integrator circuit 102 is enabled to provide another high speed shift signal. Control circuit 104 shifts the rising and falling edges of the quadrature clock signals to the right or to the left based on the high speed shift signal while high bandwidth integrator circuit 102 is prevented from providing another high speed shift signal. Preventing high bandwidth integrator circuit 102 from providing another high speed shift signal, breaks the feedback circuit loop including detector circuit 100 to high bandwidth integrator circuit 102 to control circuit 104 and back to detector circuit 100 with shifted quadrature clock signals. By breaking the feedback circuit loop, high bandwidth integrator circuit 102 can quickly integrate leading and lagging indicators and provide a high speed shift signal to control circuit 104 to shift the quadrature clock signals without destabilizing the feedback loop circuit.

Control circuit 104 receives successive high speed shift signals and provides successive approximations of the quadrature clock signals to more closely align the rising edge of the first of the four clock signals with transitions in the data D at 108. Control circuit 104 receives a first high speed shift signal and shifts the quadrature clock signals 45 degrees to the left or 45 degrees to the right as indicated by the first high speed shift signal. The reset signal is released and/or high bandwidth integrator circuit 102 is enabled to provide a second high speed shift signal to control circuit 104. Control circuit 104 receives the second high speed shift signal and shifts the quadrature clock signals 22.5 degrees to the left or 22.5 degrees to the right as indicated by the second high speed shift signal. In one embodiment, the reset signal is released and/or high bandwidth integrator circuit 102 is enabled to provide a third high speed shift signal to control circuit 104. Control circuit 104 receives the third high speed shift signal and shifts the quadrature clock signals 11.25 degrees to the left or 11.25 degrees to the right as indicated by the third high speed shift signal. In other embodiments, control circuit 104 can receive any suitable number of high speed shift signals and provide any suitable number of successive approximations of the quadrature clock signals to more closely align the rising edge of the first of the four clock signals with transitions in the data D at 108.

Control circuit 104 receives low speed shift signals from low bandwidth integrator 106 via shift communications path 124 and transmits a reset signal to low bandwidth integrator circuit 106 via reset communications path 126. The reset signal resets low bandwidth integrator circuit 106 and the reset signal is released and/or low bandwidth integrator circuit 106 is enabled to accumulate leading indicators and lagging indicators as control circuit 104 shifts the quadrature clocks to the right or to the left based on the low speed shift signal. Low bandwidth integrator circuit 106 provides low speed shift signals at a rate that is slow enough so the feedback circuit loop including detector circuit 100 to low bandwidth integrator circuit 106 to control circuit 104 and back to detector circuit 100 with shifted quadrature clock signals remains stable and is not broken. Control circuit 104 receives low speed shift signals and shifts the quadrature clock signals to the left or to the right as indicated by the low speed shift signals as low bandwidth integrator circuit 106 accumulates leading and lagging indicators.

In operation, AMB 30*a* (shown in FIG. 1) is initially in electrical idle and CDR 48*a* is held in reset. At the end of electrical idle, control circuit 104 holds low bandwidth integrator 106 in reset (i.e., disabled) and enables high bandwidth integrator circuit 102 to begin the process of successive approximations of the quadrature clock signals to lock the first (and third) of the quadrature clock signals onto transitions of data D at 108. Detector 102 receives data D at 108 and quadrature clock signals via clock signal communications path 110 and provides leading indicators and lagging indicators to high bandwidth integrator circuit 102. Leading indicators indicate the rising edge of the first one of the four clock signals leads transitions in data D at 108 by up to 90 degrees. Lagging indicators indicate the rising edge of the first one of the four clock signals lags transitions in data D at 108 by up to 90 degrees.

High bandwidth integrator circuit 102 accumulates leading indicators and lagging indicators and provides a first high speed shift signal in response to accumulating a number of leading indicators, such as eight leading indicators, or a number of lagging indicators, such as eight lagging indicators. Control circuit 104 receives the first high speed shift signal from high bandwidth integrator circuit 102 and transmits a reset signal to high bandwidth integrator circuit 102. Resetting high bandwidth integrator circuit 102 breaks the feedback circuit loop including detector circuit 100 to high bandwidth integrator circuit 102 to control circuit 104 and back to detector circuit 100 with shifted quadrature clock signals.

Control circuit 104 receives the first high speed shift signal and shifts the quadrature clock signals 45 degrees to the left or 45 degrees to the right as indicated by the first high speed shift signal. The reset signal is released and/or high bandwidth integrator circuit 102 is enabled to provide a second high speed shift signal to control circuit 104. Control circuit 104 receives the second high speed shift signal and shifts the quadrature clock signals 22.5 degrees to the left or 22.5 degrees to the right as indicated by the second high speed shift signal. At this time, the rising edge of the first of the quadrature clock signals is locked within 22.5 degrees of transitions of data D at 108. The recovered or realigned clock signals can be used to recover data from data D at 108 and to read and write data locally and transmit commands, addresses, and data. Data retimed by the recovered quadrature clock signals is transmitted to a succeeding downstream AMB, such as AMB 30*b*.

Next, control circuit 104 enables low bandwidth integrator circuit 106 and holds in reset high bandwidth integrator circuit 102. Low bandwidth integrator circuit 106 accumulates leading indicators and lagging indicators to track and fine tune the rising edge of the first one of the quadrature clock signals more closely with transitions in data D at 108. If a selected number of leading indicators or lagging indicators is accumulated separately or in relation to one another, low bandwidth integrator circuit 106 dumps a low speed shift signal to control circuit 104 that receives the low speed shift signal and transmits a reset signal to low bandwidth integrator circuit 106 via reset communications path 126. The reset signal resets the accumulator(s) in low bandwidth integrator circuit 106, but does not break the feedback circuit loop including detector circuit 100 to low bandwidth integrator circuit 106 to control circuit 104 and back to detector circuit 100 with shifted quadrature clock signals. Low bandwidth integrator circuit 106 continues to accumulate leading indicators and lagging indicators as control circuit 104 shifts the quadrature clock signals to the right or to the left based on the low speed shift signal. Control circuit 104 receives low speed shift signals and shifts the quadrature clock signals to the left or to the right as indicated by the low speed shift signals as low bandwidth integrator circuit 106 accumulates leading indicators and lagging indicators.

Figure 3:
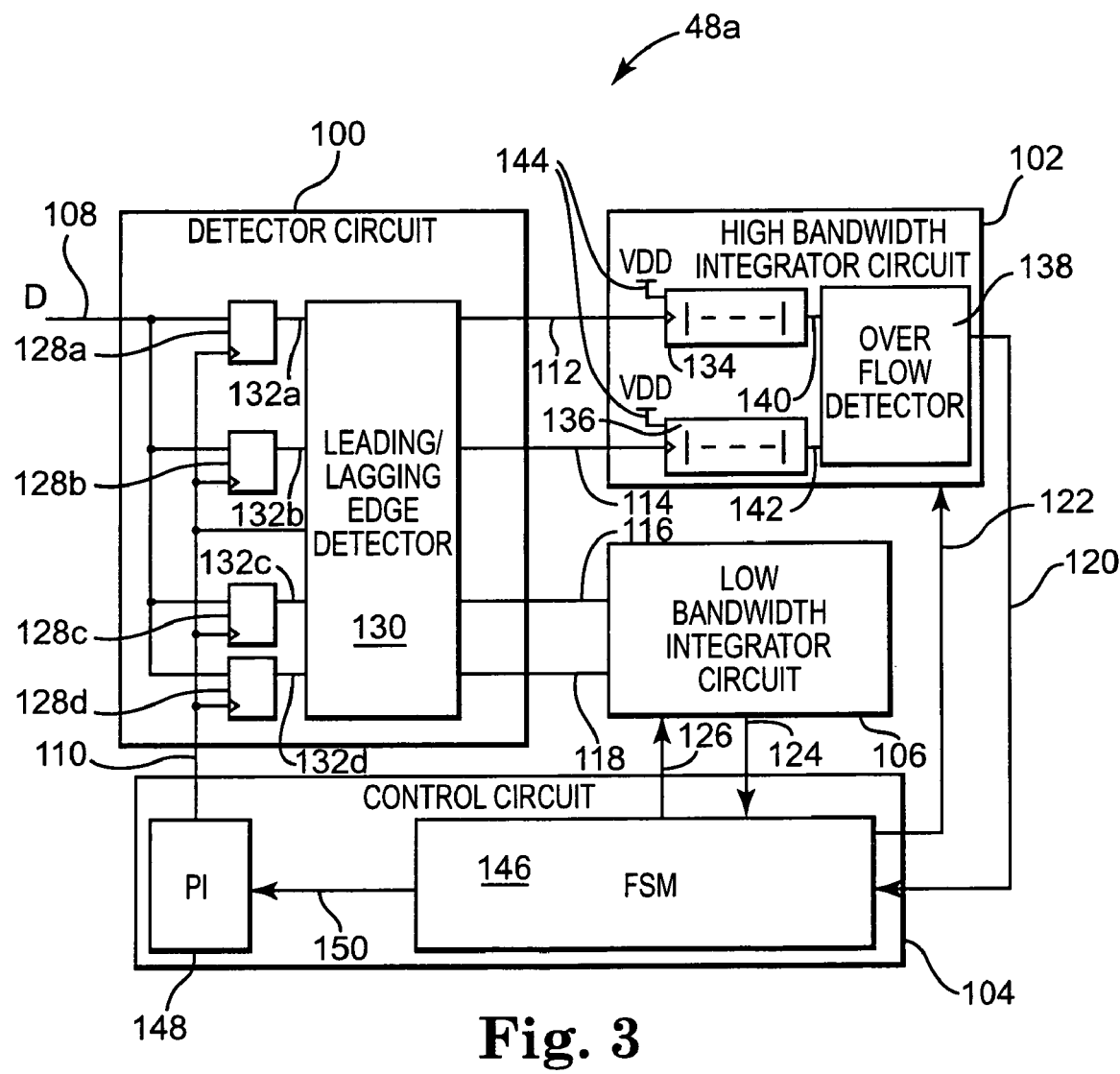
FIG. 3 is a diagram illustrating one embodiment of a CDR in more detail than FIG. 2.

FIG. 3 is a diagram illustrating one embodiment of CDR 48*a*. Each of the CDR's 48*b*-48*n* in computer system 20 of FIG. 1 can be similar to CDR 48*a*. In other embodiments, one or more of the CDR's 48*a*-48*n* can be similar to another suitable CDR.

CDR 48*a* includes detector circuit 100, high bandwidth integrator circuit 102, control circuit 104, and low bandwidth integrator circuit 106. Detector circuit 100 receives data D at 108 and is electrically coupled to control circuit 104 via clock signal communications path 110. Also, detector circuit 100 is electrically coupled to high bandwidth integrator circuit 102 via leading communications path 112 and lagging communications path 114 and to low bandwidth integrator circuit 106 via leading communications path 116 and lagging communications path 118. High bandwidth integrator circuit 102 is electrically coupled to control circuit 104 via shift communications path 120 and reset communications path 122. Low bandwidth integrator circuit 106 is electrically coupled to control circuit 104 via shift communications path 124 and reset communications path 126. Control circuit 104 is electrically coupled to detector circuit 100 via clock signal communications path 110.

Detector circuit 100 includes sampling circuits 128*a*-128*d* and leading/lagging edge detector 130. Each of the sampling circuits 128*a*-128*d* receives data D at 108 and is electrically coupled to edge detector 130 via one of the sample communications paths 132*a*-132*d*. Sampling circuit 128*a* is electrically coupled to edge detector 130 via communications path 132*a*. Sampling circuit 128*b* is electrically coupled to edge detector 130 via communications path 132*b*. Sampling circuit 128*c* is electrically coupled to edge detector 130 via communications path 132*c*, and sampling circuit 128*d* is electrically coupled to edge detector 130 via communications path 132*d*. Edge detector 130 is electrically coupled to high bandwidth integrator circuit 102 via leading communications path 112 and lagging communications path 114 and to low bandwidth integrator circuit 106 via leading communications path 116 and lagging communications path 118.

Detector circuit 100 receives the quadrature clock signals from control circuit 104 via clock signal communications path 110. Each of the four quadrature clock signals has a 50% duty cycle and oscillates at the same frequency as the other quadrature clock signals. The first of the four clock signals leads the second of the four clock signals by 90 degrees. The second of the four clock signals leads the third of the four clock signals by 90 degrees. The third of the four clock signals leads the fourth of the four clock signals by 90 degrees, and the fourth of the four clock signals leads the first of the four clock signals by 90 degrees. Data D at 108 transitions at a data rate such that data D at 108 transitions at 180 degree intervals with respect to each of the four clock signals.

Sampling circuits 128*a*-128*d* capture samples of data D at 108 and edge detector 130 detects transitions in data D at 108 based on the captured samples. Each of the sampling circuits 128*a*-128*d* is a flip-flop that receives one of the four clock signals at a rising edge triggered clock input of the flip-flop via communications path 110. Sampling circuit 128*a* receives the first of the four clock signals, sampling circuit 128*b* receives the second of the four clock signals, sampling circuit 128*c* receives the third of the four clock signals, and sampling circuit 128*d* receives the fourth of the four clock signals.

The rising edge of the first of the four clock signals leads transitions in data D at 108 by up to 90 degrees or lags transitions in data D at 108 by up to 90 degrees. Transitions in data D at 108 occur between the rising edge of the fourth of the four clock signals and the rising edge of the first of the four clock signals or between the rising edge of the first of the four clock signals and the rising edge of the second of the four clock signals. If transitions in data D at 108 occur between the rising edge of the fourth of the four clock signals and the rising edge of the first of the four clock signals, other transitions in data D at 108 occur between the rising edge of the second of the four clock signals and the rising edge of the third of the four clock signals. If transitions in data D at 108 occur between the rising edge of the first of the four clock signals and the rising edge of the second of the four clock signals, other transitions in data D at 108 occur between the rising edge of the third of the four clock signals and the rising edge of the fourth of the four clock signals. Sample values captured by adjacent sampling circuits 128*a*-128*d*, including sampling circuit 128*d* and sampling circuit 128*a* as adjacent sampling circuits, are different if a transition in data D at 108 occurs between the rising edges of the quadrature clock signals of the adjacent sampling circuits 128*a*-128*d*.

Edge detector 130 receives the captured samples via sample communication paths 132*a*-132*d* and detects transitions in data D at 108. Edge detector 130 indicates whether the rising edge of the first of the four clock signals leads or lags transitions in data D at 108. If transitions in data D at 108 occur between the rising edge of the first of the four clock signals and the rising edge of the second of the four clock signals, the rising edge of the first of the four clock signals leads transitions in data D at 108 by up to 90 degrees and edge detector 130 provides a leading indicator. If transitions in data D at 108 occur between the rising edge of the fourth of the four clock signals and the rising edge of the first of the four clock signals, the rising edge of the first of the four clock signals lags transitions in data D at 108 by up to 90 degrees and edge detector 130 provides a lagging indicator. Also, transitions detected between the rising edge of the second of the four clock signals and the rising edge of the third of the four clock signals or between the rising edge of the third of the four clock signals and the rising edge of the fourth of the four clock signals can be used to detect and confirm transitions in data D at 108 in relation to the rising edge of the first of the four clock signals.

High bandwidth integrator circuit 102 includes a leading indicator accumulator 134, a lagging indicator accumulator 136, and an overflow detector 138. Leading indicator accumulator 134 is electrically coupled to edge detector 130 via leading communications path 112 and to overflow detector 138 via leading communications path 140. Lagging indicator accumulator 136 is electrically coupled to edge detector 130 via lagging communications path 114 and to overflow detector 138 via lagging communications path 142.

Leading indicator accumulator 134 includes an eight bit shift register and lagging indicator accumulator 136 includes an eight bit shift register. Leading indicator accumulator 134 receives a logic 1, such as VDD at 144, as an input to the first bit of the eight bit shift register in the leading indicator accumulator 134 and lagging indicator accumulator 136 receives a logic 1, such as VDD at 144, as an input to the first bit of the eight bit shift register in the lagging indicator accumulator 136. During reset of high bandwidth integrator circuit 102, all bits in the eight bit shift register in the leading indicator accumulator 134 and all bits in the eight bit shift register in the lagging indicator accumulator 136 are cleared to logic 0. Overflow detector 138 is electrically coupled to control circuit 104 via shift communications path 120.

High bandwidth integrator circuit 102 accumulates leading indicators and lagging indicators and provides a high speed shift signal to control circuit 104. Leading indicator accumulator 134 receives leading indicators via leading communications path 112. Each of the received leading indicators clocks a high logic level signal, i.e., logic 1, into the first bit of the shift register of the leading indicator accumulator 134 and shifts the contents of each of the shift register bits to the next shift register bit. If high bandwidth integrator circuit 102 receives eight leading indicators before it receives eight lagging indicators, leading indicator accumulator 134 shifts a high logic level signal to overflow detector 138 that dumps a high speed shift signal to control circuit 104. The high speed shift signal indicates to shift the quadrature clock signals to the right in relation to transitions in data D at 108. Lagging indicator accumulator 136 receives lagging indicators via lagging communications path 114. Each of the received lagging indicators clocks a high logic level signal, i.e., logic 1, into the first bit of the shift register of the lagging indicator accumulator 136 and shifts the contents of each of the shift register bits to the next shift register bit. If high bandwidth integrator circuit 102 receives eight lagging indicators before it receives eight leading indicators, lagging indicator accumulator 136 shifts a high logic level signal to overflow detector 138 that dumps a high speed shift signal to control circuit 104. The high speed shift signal indicates to shift the quadrature clock signals to the left in relation to transitions in data D at 108. In one embodiment, edge detector 130 provides and high bandwidth integrator circuit 102 receives leading indicators and lagging indicators at the data rate of data D at 108.

Low bandwidth integrator circuit 106 accumulates leading indicators and lagging indicators and provides a low speed shift signal to control circuit 104 to track and fine tune the rising edge of the first one of the quadrature clock signals more closely with transitions in data D at 108. Low bandwidth integrator circuit 106 receives leading indicators via leading communications path 116 and lagging indicators via lagging communications path 118. Low bandwidth integrator circuit 106 can accumulate leading indicators and lagging indicators in any suitable integrator, such as an integrator that accumulates leading indicators and lagging indicators in separate accumulators or an integrator that accumulates leading indicators and lagging indicators in a central addition/subtraction type accumulator. If a selected number of leading indicators, such as greater than eight, is accumulated, low bandwidth integrator circuit 106 dumps a low speed shift signal to control circuit 104 to shift quadrature clocks to the right in relation to transitions in data D at 108. If a selected number of lagging indicators, such as greater than eight, is accumulated, low bandwidth integrator circuit 106 dumps a low speed shift signal to control circuit 104 to shift quadrature clocks to the left in relation to transitions in data D at 108. The low speed shift signal indicates whether the rising edge of the first one of the quadrature clock signals is leading or lagging transitions in the data D at 108 and to shift the quadrature clock signals to the right or to the left to align the rising edge of the first one of the quadrature clock signals more closely with transitions in data D at 108.

In one embodiment, low bandwidth integrator circuit 106 receives leading indicators and lagging indicators at the data rate of data D at 108 and accumulates a larger number of leading indicators and lagging indicators, as compared to high bandwidth integrator 102, prior to dumping a low speed shift signal to control circuit 104. In one embodiment, leading indicators and lagging indicators from detector circuit 100 are decimated or divided down to indicate leading and lagging transitions at a fraction of the data rate D at 108. Low bandwidth integrator circuit 106 receives the decimated leading indicators and lagging indicators and accumulates a certain number prior to dumping a low speed shift signal to control circuit 104. In other embodiments, detector circuit 100 and low bandwidth integrator circuit 106 provide a combination of decimated leading and lagging indicators and accumulating a larger number of leading and lagging indicators prior to dumping the low speed shift signal. In other embodiments, any suitable scheme can be used to provide a low speed shift signal to control circuit 104.

Control circuit 104 includes a finite state machine (FSM) 146 and a phase interpolator (PI) 148. FSM 146 is electrically coupled to overflow detector 138 via shift communications path 120 and to high bandwidth integrator circuit 102 via reset communications path 122. Also, FSM 146 is electrically coupled to low bandwidth integrator circuit 106 via shift communications path 124 and reset communications path 126. In addition, FSM 146 is electrically coupled to PI 148 via phase shift communications path 150. PI 148 is electrically coupled to sampling circuits 128a-128d via clock signal communications path 110.

FSM 146 receives a high speed shift signal from overflow detector 138 via shift communications path 120 and transmits a reset signal to high bandwidth integrator circuit 102 via reset communications path 122 and a phase shift signal to PI 148 via phase shift communications path 150. PI 148 receives the phase shift signal and shifts the quadrature clock signals to the right or to the left based on the received phase shift signal. The reset signal clears all bits in the eight bit shift register in the leading indicator accumulator 134 and all bits in the eight bit shift register in the lagging indicator accumulator 136 to logic 0 and holds leading indicator accumulator 134 and lagging indicator accumulator 136 in reset while PI 148 shifts the quadrature clock signals. This prevents overflow detector 138 from providing another high speed shift signal to FSM 146 while PI 148 shifts the quadrature clock signals. Preventing overflow detector 138 from providing another high speed shift signal breaks the feedback circuit loop including detector circuit 100 to high bandwidth integrator circuit 102 to control circuit 104 and back to detector circuit 100. By breaking this feedback circuit loop, high bandwidth integrator circuit 102 can quickly integrate leading and lagging indicators and provide a high speed shift signal to control circuit 104 to shift the quadrature clock signals without destabilizing the feedback loop circuit. After PI 148 shifts the quadrature clock signals, FSM 146 removes the reset signal and overflow detector 138 provides another high speed shift signal to FSM 146, which transmits a reset signal to high bandwidth integrator circuit 102 via reset communications path 122 and a phase shift signal to PI 148 via phase shift communications path 150.

FSM 146 receives successive high speed shift signals and provides successive phase shift signals to PI 148 that provides successive approximations in the quadrature clock signals to align the rising edge of the first of the four clock signals with transitions in the data D at 108. After electrical idle is de-asserted, control circuit 104 holds low bandwidth integrator 106 in reset (i.e., disabled) and enables high bandwidth integrator circuit 102 to begin the process of successive approximations of the quadrature clock signals. FSM 146 receives a first high speed shift signal and provides a first phase shift signal to PI 148 that shifts the quadrature clock signals 45 degrees to the left or 45 degrees to the right. The reset signal is removed from the high bandwidth integrator circuit 102 and overflow detector 138 provides a second high speed shift signal to FSM 146 via shift communications path 120. FSM 146 receives the second high speed shift signal and provides a second phase shift signal to PI 148 that shifts the quadrature clock signals 22.5 degrees to the left or 22.5 degrees to the right. In one embodiment, the reset signal is removed from the high bandwidth integrator circuit 102 again and overflow detector 138 provides a third high speed shift signal to FSM 146, which provides a third phase shift signal to PI 148 that shifts the quadrature clock signals 11.25 degrees to the left or 11.25 degrees to the right as indicated by the third high speed shift signal. In other embodiments, FSM 146 can receive any suitable number of high speed shift signals and PI 148 can provide any suitable number of successive approximations of the quadrature clock signals to align the rising edge of the first of the four clock signals with transitions in the data D at 108.

FSM 146 receives low speed shift signals from low bandwidth integrator 106 via shift communications path 124 and transmits a reset signal to low bandwidth integrator circuit 106 via reset communications path 126 and a phase shift signal to PI 148 via phase shift communications path 150. PI 148 receives the phase shift signal and shifts the quadrature clock signals to the right or to the left based on the received phase shift signal. The reset signal resets low bandwidth integrator circuit 106 and is then removed to enable low bandwidth integrator circuit 106 to accumulate leading indicators and lagging indicators as PI 148 shifts the quadrature clocks to the right or to the left based on the phase shift signal. Low bandwidth integrator circuit 106 provides low speed shift signals at a rate that is slow enough that the feedback circuit loop including detector circuit 100 to low bandwidth integrator circuit 106 to control circuit 104 and back to detector circuit 100 remains stable. FSM 146 receives low speed shift signals and PI 148 shifts the quadrature clock signals to the left or to the right as low bandwidth integrator circuit 106 accumulates leading and lagging indicators.

In operation, AMB 30a (shown in FIG. 1) is initially in electrical idle and CDR 48a is held in reset, with high bandwidth integrator circuit 102 held in reset and the eight bit shift register in the leading indicator accumulator 134 and the eight bit shift register in the lagging indicator accumulator 136 cleared to logic 0 and low bandwidth integrator circuit 106 held in reset to disable low bandwidth integrator circuit 106 and clear the accumulator(s) in low bandwidth integrator circuit 106. At the end of electrical idle, FSM 146 removes the reset on high bandwidth integrator circuit 102 and resets are removed from leading indicator accumulator 134 and lagging indicator accumulator 136. Low bandwidth integrator circuit 106 remains held in reset (disabled), and CDR 48a begins the process of successive approximations of the quadrature clock signals to lock the first of the quadrature clock signals near transitions of data D at 108.

Sampling circuits 128a-128d receive data D at 108 and quadrature clock signals via clock signal communications path 110. Sampling circuits 128a-128d sample data D at 108 and provide captured samples to edge detector 130 via sample communications paths 132a-132d. Edge detector 130 provides leading indicators to leading indicator accumulator 134 and lagging indicators to lagging indicator accumulator 136. Leading indicators indicate the rising edge of the first of the four clock signals leads transitions in data D at 108 by up to 90 degrees. Lagging indicators indicate the rising edge of the first of the four clock signals lags transitions in data D at 108 by up to 90 degrees.

Leading indicator accumulator 134 accumulates leading indicators and lagging indicator accumulator 136 accumulates lagging indicators. Leading indicator accumulator 134 accumulates leading indicators by shifting high logic levels into and through a shift register in response to the leading indicators. Lagging indicator accumulator 136 accumulates lagging indicators by shifting high logic levels into and through a shift register in response to the lagging indicators. If eight leading indicators or eight lagging indicators are accumulated, overflow detector 138 provides a first high speed shift signal to FSM 146 via shift communications path 120. The first high speed shift signal indicates whether the rising edge of the first of the quadrature signals leads or lags transitions in data D at 108.

FSM 146 receives the first high speed shift signal from overflow detector 138 and transmits a reset signal to high bandwidth integrator circuit 102, which disables high bandwidth integrator circuit 102 and clears all bits in the shift register in the leading indicator accumulator 134 and all bits in the shift register in the lagging indicator accumulator 136 to logic 0. Also, FSM 146 transmits a first phase shift signal to PI 148. Holding leading indicator accumulator 134 and lagging indicator accumulator 136 in reset breaks the feedback circuit loop including detector circuit 100 to high bandwidth integrator circuit 102 to control circuit 104 and back to detector circuit 100. PI 148 receives the first phase shift signal and shifts the quadrature clock signals 45 degrees to the left or 45 degrees to the right as indicated by the first phase shift signal. PI 148 shifts the quadrature clock signals while leading indicator accumulator 134 and lagging indicator accumulator 136 are held in reset.

Next, FSM 146 removes the resets on leading indicator accumulator 134 and lagging indicator accumulator 136 and overflow detector 138 provides a second high speed shift signal to FSM 146. FSM 146 receives the second high speed shift signal from overflow detector 138 and transmits a reset signal to high bandwidth integrator circuit 102 and a second phase shift signal to PI 148. Holding leading indicator accumulator 134 and lagging indicator accumulator 136 in reset breaks the feedback circuit loop including detector circuit 100 to high bandwidth integrator circuit 102 to control circuit 104 and back to detector circuit 100. PI 148 receives the second phase shift signal and shifts the quadrature clock signals 22.5 degrees to the left or 22.5 degrees to the right as indicated by the second phase shift signal. After this, the rising edge of the first of the quadrature clock signals is locked within 22.5 degrees of transitions of data D at 108. The recovered or realigned quadrature clock signals can be used to recover data from data D at 108 and to read and write data locally and transmit commands, addresses, and data. Data retimed by the recovered quadrature clock signals is transmitted to a succeeding downstream AMB, such as AMB 30b (shown in FIG. 1).

Next, FSM 146 removes the reset on low bandwidth integrator circuit 106 and holds high bandwidth integrator circuit 102 in reset. Low bandwidth integrator circuit 106 accumulates leading indicators and lagging indicators. If a selected number of leading indicators or lagging indicators is accumulated separately or in relation to one another, low bandwidth integrator circuit 106 dumps a low speed shift signal to FSM 146 that receives the low speed shift signal and transmits a reset signal to low bandwidth integrator circuit 106 via reset communications path 126 and a phase shift signal to PI 148. The reset signal resets the accumulator(s) in low bandwidth integrator circuit 106 and low bandwidth integrator circuit 106 continues to accumulate leading indicators and lagging indicators as PI 148 shifts the quadrature clock signals to the right or to the left based on the phase shift signal. FSM 146 continues to receive low speed shift signals and PI 148 shifts the quadrature clock signals to the left or to the right as low bandwidth integrator circuit 106 accumulates leading indicators and lagging indicators.

Figure 4:
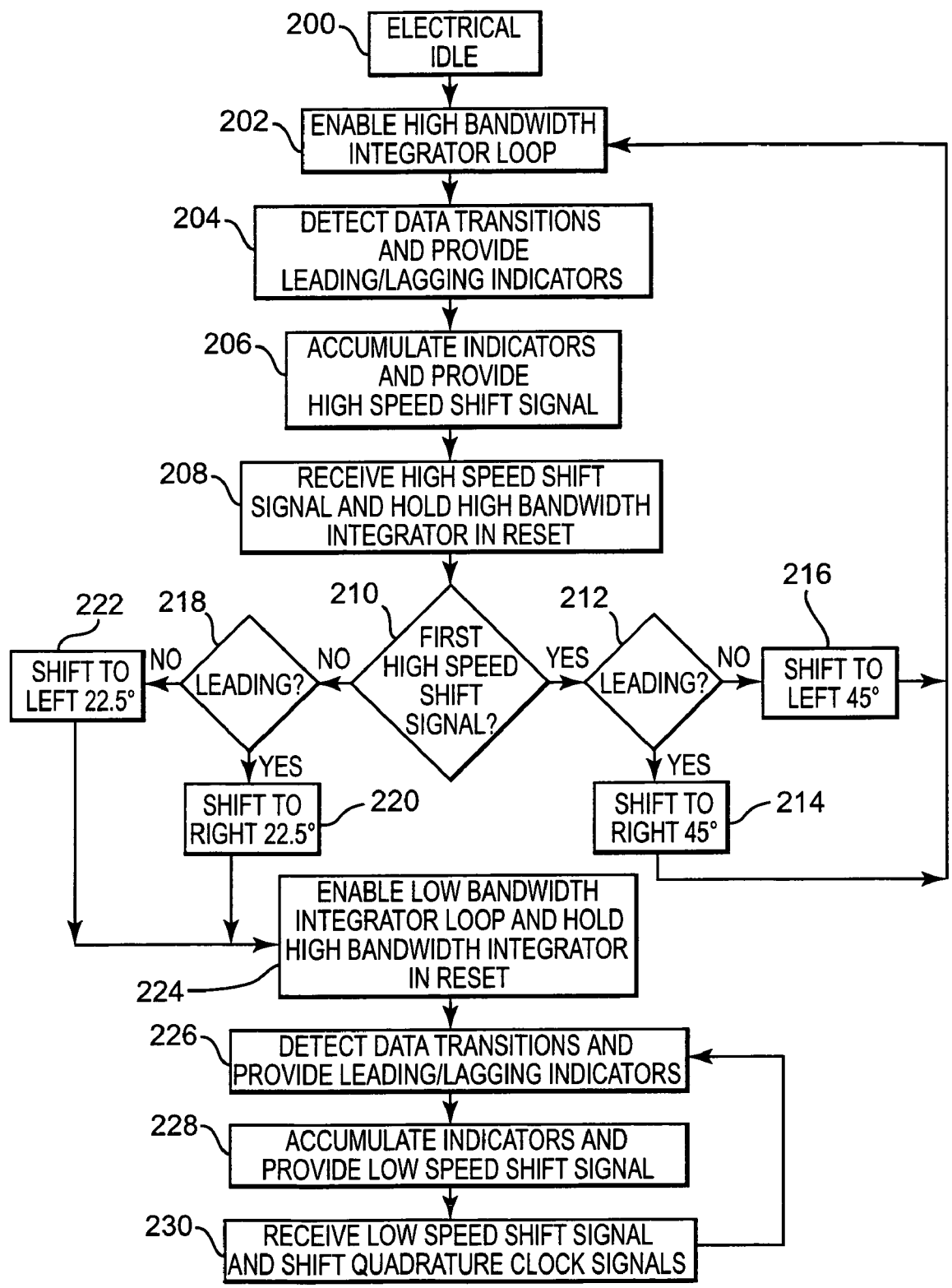
FIG. 4 is a flow chart diagram illustrating the operation of one embodiment of a CDR.

FIG. 4 is a flowchart diagram illustrating the operation of one embodiment of CDR 48a. At 200, AMB 30a (shown in FIG. 1) is in electrical idle and CDR 48a is held in reset, with high bandwidth integrator circuit 102 held in reset and low bandwidth integrator circuit 106 held in reset. As electrical idle is released, FSM 146 enables high bandwidth integrator circuit 102 at 202 and resets are removed from leading indicator accumulator 134 and lagging indicator accumulator 136. Low bandwidth integrator circuit 106 remains held in reset.

At 204, sampling circuits 128a-128d sample data D at 108 and provide captured samples to edge detector 130 via sample communications paths 132a-132d. Edge detector 130 provides leading indicators to leading indicator accumulator 134 and lagging indicators to lagging indicator accumulator 136. Leading indicators indicate the rising edge of the first of the four clock signals leads transitions in data D at 108 by up to 90 degrees. Lagging indicators indicate the rising edge of the first of the four clock signals lags transitions in data D at 108 by up to 90 degrees.

At 206, leading indicator accumulator 134 accumulates leading indicators and lagging indicator accumulator 136 accumulates lagging indicators. Leading indicator accumulator 134 accumulates leading indicators by shifting high logic levels into and through a shift register in response to the leading indicators. Lagging indicator accumulator 136 accumulates lagging indicators by shifting high logic levels into and through a shift register in response to the lagging indicators. If eight leading indicators or eight lagging indicators are accumulated, overflow detector 138 provides a high speed shift signal to FSM 146 via shift communications path 120. The high speed shift signal indicates whether the rising edge of the first of the quadrature signals leads or lags transitions in data D at 108.

At 208, FSM 146 receives the high speed shift signal from overflow detector 138 and transmits a reset signal to hold high bandwidth integrator circuit 102 in reset. Holding leading indicator accumulator 134 and lagging indicator accumulator 136 in reset breaks the feedback circuit loop including detector circuit 100 to high bandwidth integrator circuit 102 to control circuit 104 and back to detector circuit 100. At 210, if the received high speed shift signal is the first high speed shift signal since releasing electrical idle, the quadrature clock signals are shifted 45 degrees to the right or 45 degrees to the left.

At 212, if the first high speed shift signal indicates the rising edge of the first of the quadrature clock signals leads transitions in data D at 108, PI 148 receives the first phase shift signal and shifts the quadrature clock signals 45 degrees to the right at 214. At 212, if the first high speed shift signal indicates the rising edge of the first of the quadrature clock signals lags transitions in data D at 108, PI 148 receives the first phase shift signal and shifts the quadrature clock signals 45 degrees to the left at 216.

Next, FSM 146 enables high bandwidth integrator circuit 102 at 202 and resets are removed from leading indicator accumulator 134 and lagging indicator accumulator 136. Low bandwidth integrator circuit 106 remains held in reset. At 204, sampling circuits 128a-128d sample data D at 108 and provide captured samples to edge detector 130 via sample communications paths 132a-132d. Edge detector 130 provides leading indicators to leading indicator accumulator 134 and lagging indicators to lagging indicator accumulator 136. At 206, leading indicator accumulator 134 accumulates leading indicators and lagging indicator accumulator 136 accumulates lagging indicators. If eight leading indicators or eight lagging indicators are accumulated, overflow detector 138 provides a high speed shift signal to FSM 146 via shift communications path 120. At 208, FSM 146 receives the high speed shift signal from overflow detector 138 and transmits a reset signal to hold high bandwidth integrator circuit 102 in reset. Holding leading indicator accumulator 134 and lagging indicator accumulator 136 in reset breaks the feedback circuit loop including detector circuit 100 to high bandwidth integrator circuit 102 to control circuit 104 and back to detector circuit 100.

At 210, if the received high speed shift signal is the second high speed shift signal since releasing electrical idle, the quadrature clock signals are shifted 22.5 degrees to the right or 22.5 degrees to the left. At 218, if the second high speed shift signal indicates the rising edge of the first of the quadrature clock signals leads transitions in data D at 108, PI 148 receives the second phase shift signal and shifts the quadrature clock signals 22.5 degrees to the right at 220. At 218, if the second high speed shift signal indicates the rising edge of the first of the quadrature clock signals lags transitions in data D at 108, PI 148 receives the second phase shift signal and shifts the quadrature clock signals 22.5 degrees to the left at 222. After this, the rising edge of the first of the quadrature clock signals is locked within 22.5 degrees of transitions of data D at 108. The recovered or realigned quadrature clock signals can be used to recover data from data D at 108 and to read and write data locally and transmit commands, addresses, and data. Data retimed by the recovered quadrature clock signals is transmitted to a succeeding downstream AMB, such as AMB 30b (shown in FIG. 1).

Next, at 224, FSM 146 removes the reset on low bandwidth integrator circuit 106 and holds high bandwidth integrator circuit 102 in reset. At 226, sampling circuits 128a-128d sample data D at 108 and provide captured samples to edge detector 130 via sample communications paths 132a-132d. Edge detector 130 provides leading indicators and lagging indicators to low bandwidth integrator circuit 106. At 228, low bandwidth integrator circuit 106 accumulates leading indicators and lagging indicators and if a selected number of leading indicators or lagging indicators is accumulated separately or in relation to one another, low bandwidth integrator circuit 106 dumps a low speed shift signal to FSM 146. At 230, FSM 146 receives the low speed shift signal and transmits a reset signal to low bandwidth integrator circuit 106 via reset communications path 126 and a phase shift signal to PI 148. The reset signal resets low bandwidth integrator circuit 106 and is then removed. Low bandwidth integrator circuit 106 returns to accumulating leading indicators and lagging indicators at 226 as PI 148 shifts the quadrature clock signals to the right or to the left based on the phase shift signal. FSM 146 continues to receive low speed shift signals and PI 148 shifts the quadrature clock signals to the left or to the right as low bandwidth integrator circuit 106 accumulates leading indicators and lagging indicators.

Figure 5:
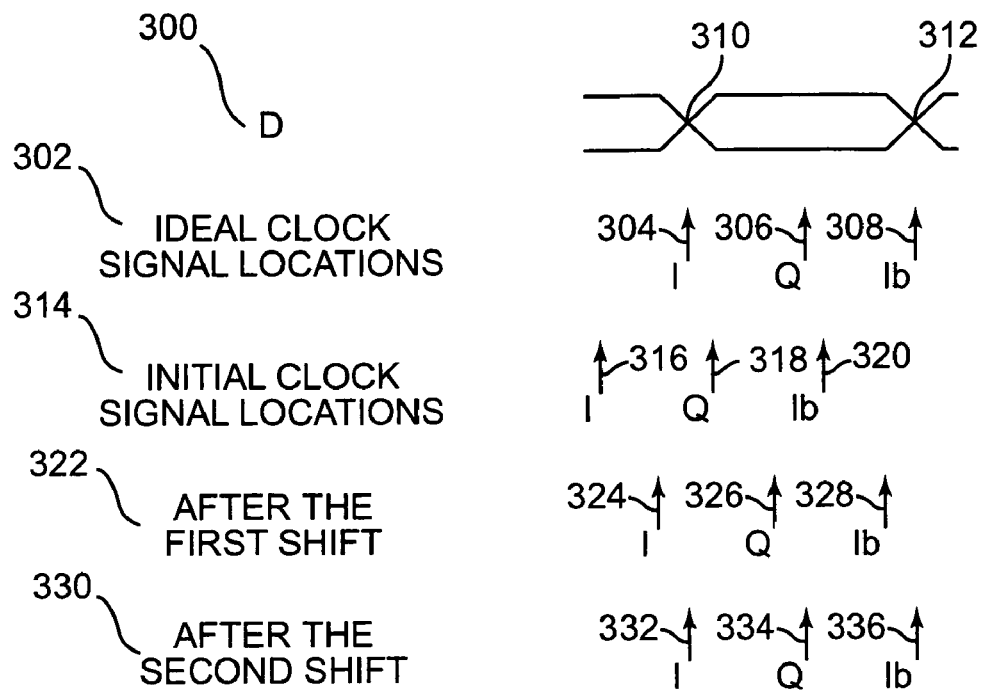
FIG. 5 is a diagram illustrating a first example operation of one embodiment of a CDR.

FIG. 5 is a diagram illustrating one example operation of one embodiment of CDR 48a. Data D at 300 is received by sampling circuits 128a-128d. At 302, the ideal clock signal locations indicate ideal locations for the rising edge of the first of the four quadrature clock signals I at 304, the rising edge of the second of the four quadrature clock signals Q at 306, and the rising edge of the third of the four quadrature clock signals Ib at 308. The rising edge of the fourth of the four quadrature clock signals is not shown. Ideally, the rising edge of the first of the four quadrature clock signals I at 304 is aligned with transitions at 310 in data D at 300, the rising edge of the second of the four quadrature clock signals Q at 306 is aligned with the middle of the eye of data D at 300, and the rising edge of the third of the four quadrature clock signals Ib at 308 is aligned with transitions at 312 in data D at 300.

To begin, the initial clock signal locations at 314 indicate transitions at 310 in data D at 300 occur between the rising edge of the first of the four quadrature clock signals I at 316 and the rising edge of the second of the four quadrature clock signals Q at 318. Transitions in data D at 300 do not occur between the rising edge of the second of the four quadrature clock signals Q at 318 and the rising edge of the third of the four quadrature clock signals Ib at 320. The rising edge of the first of the four quadrature clock signals I at 316 leads transitions at 310 in data D at 300 and edge detector 130 provides leading indicators to leading indicator accumulator 134 of high bandwidth integrator circuit 102.

After eight leading indicators are accumulated, overflow detector 138 provides a high speed shift signal to FSM 146 via shift communications path 120. The high speed shift signal indicates that the rising edge of the first of the four quadrature clock signals I at 316 leads transitions at 310 in data D at 300. FSM 146 receives the high speed shift signal from overflow detector 138 and transmits a reset signal to hold high bandwidth integrator circuit 102 in reset. Holding leading indicator accumulator 134 and lagging indicator accumulator 136 in reset breaks the feedback circuit loop including detector circuit 100 to high bandwidth integrator circuit 102 to control circuit 104 and back to detector circuit 100. The received high speed shift signal is the first high speed shift signal after releasing electrical idle and PI 148 shifts the quadrature clock signals 45 degrees to the right.

The signals after the first shift at 322 indicate transitions at 310 in data D at 300 still occur between the rising edge of the first of the four quadrature clock signals I at 324 and the rising edge of the second of the four quadrature clock signals Q at 326. Transitions in data D at 300 do not occur between the rising edge of the second of the four quadrature clock signals Q at 326 and the rising edge of the third of the four quadrature clock signals Ib at 328. The rising edge of the first of the four quadrature clock signals I at 324 still leads transitions at 310 in data D at 300 and edge detector 130 provides leading indicators to leading indicator accumulator 134 of high bandwidth integrator circuit 102.

After eight leading indicators are accumulated, overflow detector 138 provides a second high speed shift signal to FSM 146 via shift communications path 120. The second high speed shift signal indicates that the rising edge of the first of the four quadrature clock signals I at 324 leads transitions at 310 in data D at 300. FSM 146 receives the second high speed shift signal from overflow detector 138 and transmits a reset signal to hold high bandwidth integrator circuit 102 in reset. Holding leading indicator accumulator 134 and lagging indicator accumulator 136 in reset breaks the feedback circuit loop including detector circuit 100 to high bandwidth integrator circuit 102 to control circuit 104 and back to detector circuit 100. The high speed shift signal is the second high speed shift signal after releasing electrical idle and PI 148 shifts the quadrature clock signals 22.5 degrees to the right.

After the second shift at 330 the rising edge of the first of the quadrature clock signals I at 332 is locked within 22.5 degrees of transitions at 310 of data D at 300. The recovered or realigned quadrature clock signals can be used to recover data from data D at 300 and to read and write data locally and transmit commands, addresses, and data. Data retimed by the recovered quadrature clock signals is transmitted to a succeeding downstream AMB, such as AMB 30*b* (shown in FIG. 1). In this example, after the second shift at 330 indicates transitions at 310 in data D at 300 still occur between the rising edge of the first of the four quadrature clock signals I at 332 and the rising edge of the second of the four quadrature clock signals Q at 334. Transitions in data D at 300 do not occur between the rising edge of the second of the four quadrature clock signals Q at 334 and the rising edge of the third of the four quadrature clock signals Ib at 336. The rising edge of the first of the four quadrature clock signals I at 332 still leads transitions at 310 in data D at 300 and edge detector 130 provides leading indicators to low bandwidth integrator circuit 106, which slowly moves the rising edge of the first of the four quadrature clock signals I at 332 toward transitions at 310 in data D at 300.

Figure 6:
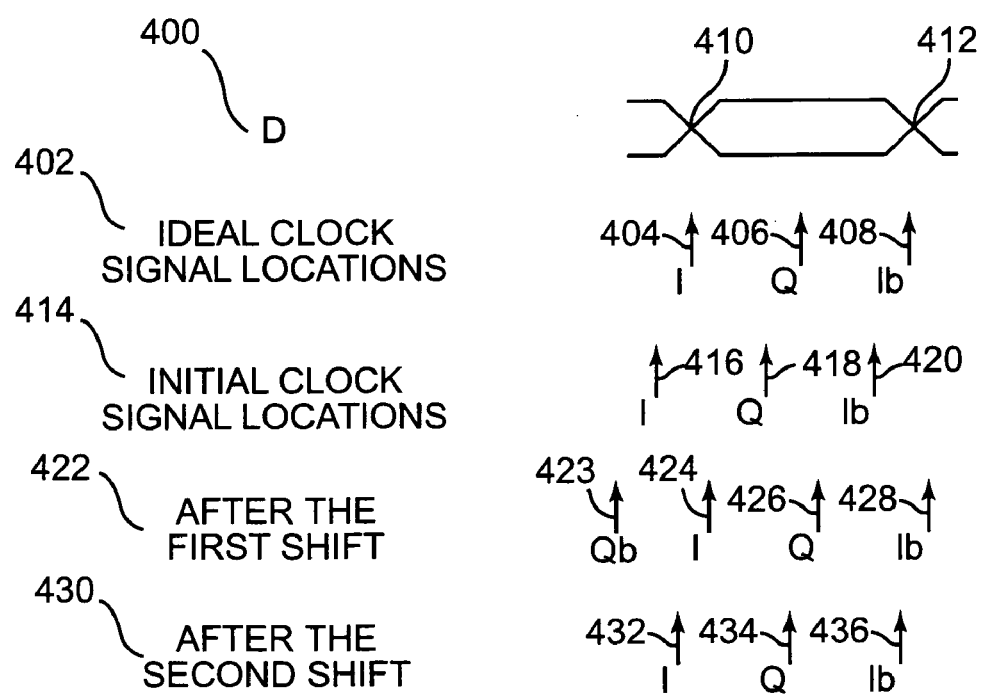
FIG. 6 is a diagram illustrating a second example operation of one embodiment of a CDR.

FIG. 6 is a diagram illustrating another example operation of one embodiment of CDR 48*a*. Data D at 400 is received by sampling circuits 128*a*-128*d*. At 402, the ideal clock signal locations indicate ideal locations for the rising edge of the first of the four quadrature clock signals I at 404, the rising edge of the second of the four quadrature clock signals Q at 406, and the rising edge of the third of the four quadrature clock signals Ib at 408. Ideally, the rising edge of the first of the four quadrature clock signals I at 404 is aligned with transitions at 410 in data D at 400, the rising edge of the second of the four quadrature clock signals Q at 406 is aligned with the middle of the eye of data D at 400, the rising edge of the third of the four quadrature clock signals Ib at 408 is aligned with transitions at 412 in data D at 400, and the rising edge of the fourth of the four quadrature clock signals Qb is aligned with the middle of the eye of data D at 400.

To begin, the initial clock signal locations at 414 indicate transitions at 410 in data D at 400 occur between the rising edge of the first of the four quadrature clock signals I at 416 and the rising edge of the second of the four quadrature clock signals Q at 418. Transitions in data D at 400 do not occur between the rising edge of the second of the four quadrature clock signals Q at 418 and the rising edge of the third of the four quadrature clock signals Ib at 420. The rising edge of the first of the four quadrature clock signals I at 416 leads transitions at 410 in data D at 400 and edge detector 130 provides leading indicators to leading indicator accumulator 134 of high bandwidth integrator circuit 102.

After eight leading indicators are accumulated, overflow detector 138 provides a high speed shift signal to FSM 146 via shift communications path 120. The high speed shift signal indicates that the rising edge of the first of the four quadrature clock signals I at 416 leads transitions at 410 in data D at 400. FSM 146 receives the high speed shift signal from overflow detector 138 and transmits a reset signal to hold high bandwidth integrator circuit 102 in reset. Holding leading indicator accumulator 134 and lagging indicator accumulator 136 in reset breaks the feedback circuit loop including detector circuit 100 to high bandwidth integrator circuit 102 to control circuit 104 and back to detector circuit 100. The received high speed shift signal is the first high speed shift signal after releasing electrical idle and PI 148 shifts the quadrature clock signals 45 degrees to the right.

The signals after the first shift at 422 indicate transitions at 410 in data D at 400 occur between the rising edge of the fourth of the four quadrature clock signals Qb at 423 and the rising edge of the first of the four quadrature clock signals I at 424. Transitions in data D at 400 do not occur between the rising edge of the first of the four quadrature clock signals I at 424 and the rising edge of the second of the four quadrature clock signals Q at 426. Transitions at 412 in data D at 400 occur between the rising edge of the second of the four quadrature clock signals Q at 426 and the rising edge of the third of the four quadrature clock signals Ib at 428. The rising edge of the first of the four quadrature clock signals I at 424 lags transitions at 410 in data D at 400 and edge detector 130 provides lagging indicators to lagging indicator accumulator 136 of high bandwidth integrator circuit 102.

After eight lagging indicators are accumulated, overflow detector 138 provides a second high speed shift signal to FSM 146 via shift communications path 120. The second high speed shift signal indicates that the rising edge of the first of the four quadrature clock signals I at 424 lags transitions at 410 in data D at 400. FSM 146 receives the second high speed shift signal from overflow detector 138 and transmits a reset signal to hold high bandwidth integrator circuit 102 in reset. Holding leading indicator accumulator 134 and lagging indicator accumulator 136 in reset breaks the feedback circuit loop including detector circuit 100 to high bandwidth integrator circuit 102 to control circuit 104 and back to detector circuit 100. The high speed shift signal is the second high speed shift signal after releasing electrical idle and PI 148 shifts the quadrature clock signals 22.5 degrees to the left.

After the second shift at 430 the rising edge of the first of the quadrature clock signals I at 432 is locked within 22.5 degrees of transitions at 410 of data D at 400, the rising edge of the second of the quadrature clock signals Q at 434 is locked within 22.5 degrees of the middle of the eye of data D at 400, the rising edge of the third of the quadrature clock signals Ib at 436 is locked within 22.5 degrees of transitions at 412 of data D at 400, and the rising edge of the fourth of the quadrature clock signals Qb is locked within 22.5 degrees of the middle of the eye of data D at 400. The recovered or realigned quadrature clock signals can be used to recover data from data D at 400 and to read and write data locally and transmit commands, addresses, and data. Data retimed by the recovered quadrature clock signals is transmitted to a succeeding downstream AMB, such as AMB 30b (shown in FIG. 1). Edge detector 130 provides leading and lagging indicators to low bandwidth integrator circuit 106, which slowly moves the quadrature clock signals, such that the rising edge of the first of the four quadrature clock signals I at 432 is more closely aligned with transitions at 410 in data D at 400.

Figure 7:
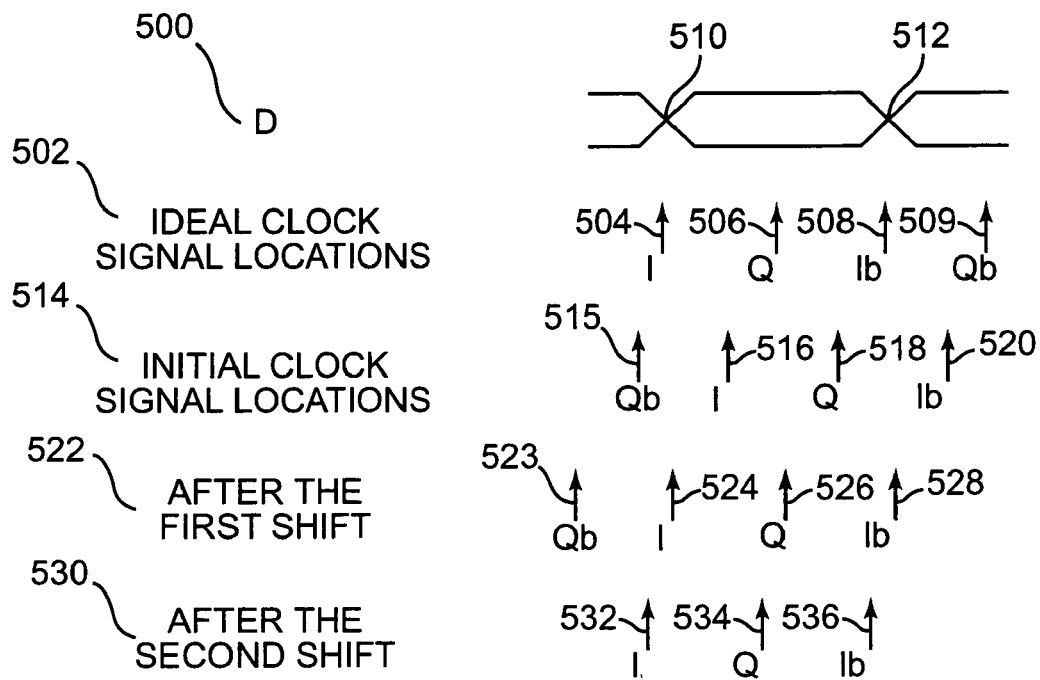
FIG. 7 is a diagram illustrating a third example operation of one embodiment of a CDR.

FIG. 7 is a diagram illustrating another example operation of one embodiment of CDR 48a. Data D at 500 is received by sampling circuits 128a-128d. The ideal clock signal locations at 502 indicate ideal locations for the rising edge of the first of the four quadrature clock signals I at 504, the rising edge of the second of the four quadrature clock signals Q at 506, the rising edge of the third of the four quadrature clock signals Ib at 508, and the rising edge of the fourth of the four quadrature clock signals Qb at 509. Ideally, the rising edge of the first of the four quadrature clock signals I at 504 is aligned with transitions at 510 in data D at 500, the rising edge of the second of the four quadrature clock signals Q at 506 is aligned with the middle of the eye of data D at 500, the rising edge of the third of the four quadrature clock signals Ib at 508 is aligned with transitions at 512 in data D at 500, and the rising edge of the fourth of the four quadrature clock signals Qb at 509 is aligned with the middle of the eye of data D at 500.

To begin, the initial clock signal locations at 514 indicate transitions at 510 in data D at 500 occur between the rising edge of the fourth of the four quadrature clock signals Qb at 515 and the rising edge of the first of the four quadrature clock signals I at 516. Transitions in data D at 500 do not occur between the rising edge of the first of the four quadrature clock signals I at 516 and the rising edge of the second of the four quadrature clock signals Q at 518. Also, transitions 512 in data D at 500 occur between the rising edge of the second of the four quadrature clock signals Q at 518 and the rising edge of the third of the four quadrature clock signals Ib at 520. The rising edge of the first of the four quadrature clock signals I at 516 lags transitions at 510 in data D at 500 and edge detector 130 provides lagging indicators to lagging indicator accumulator 136 of high bandwidth integrator circuit 102.

After eight lagging indicators are accumulated, overflow detector 138 provides a high speed shift signal to FSM 146 via shift communications path 120. The high speed shift signal indicates that the rising edge of the first of the four quadrature clock signals I at 516 lags transitions at 510 in data D at 500. FSM 146 receives the high speed shift signal from overflow detector 138 and transmits a reset signal to hold high bandwidth integrator circuit 102 in reset. Holding leading indicator accumulator 134 and lagging indicator accumulator 136 in reset breaks the feedback circuit loop including detector circuit 100 to high bandwidth integrator circuit 102 to control circuit 104 and back to detector circuit 100. The received high speed shift signal is the first high speed shift signal after releasing electrical idle and PI 148 shifts the quadrature clock signals 45 degrees to the left.

The signals after the first shift at 522 indicate transitions at 510 in data D at 500 occur between the rising edge of the fourth of the four quadrature clock signals Qb at 523 and the rising edge of the first of the four quadrature clock signals I at 524. Transitions in data D at 500 do not occur between the rising edge of the first of the four quadrature clock signals I at 524 and the rising edge of the second of the four quadrature clock signals Q at 526. Transitions at 512 in data D at 500 occur between the rising edge of the second of the four quadrature clock signals Q at 526 and the rising edge of the third of the four quadrature clock signals Ib at 528. The rising edge of the first of the four quadrature clock signals I at 524 lags transitions at 510 in data D at 500 and edge detector 130 provides lagging indicators to lagging indicator accumulator 136 of high bandwidth integrator circuit 102.

After eight lagging indicators are accumulated, overflow detector 138 provides a second high speed shift signal to FSM 146 via shift communications path 120. The second high speed shift signal indicates that the rising edge of the first of the four quadrature clock signals I at 524 lags transitions at 510 in data D at 500. FSM 146 receives the second high speed shift signal from overflow detector 138 and transmits a reset signal to hold high bandwidth integrator circuit 102 in reset. Holding leading indicator accumulator 134 and lagging indicator accumulator 136 in reset breaks the feedback circuit loop including detector circuit 100 to high bandwidth integrator circuit 102 to control circuit 104 and back to detector circuit 100. The high speed shift signal is the second high speed shift signal after releasing electrical idle and PI 148 shifts the quadrature clock signals 22.5 degrees to the left.

After the second shift at 530 the rising edge of the first of the quadrature clock signals I at 532 is locked within 22.5 degrees of transitions at 510 of data D at 500, the rising edge of the second of the quadrature clock signals Q at 534 is locked within 22.5 degrees of the middle of the eye of data D at 500, the rising edge of the third of the quadrature clock signals Ib at 536 is locked within 22.5 degrees of transitions at 512 of data D at 500, and the rising edge of the fourth of the quadrature clock signals Qb is locked within 22.5 degrees of the middle of the eye of data D at 500. The recovered or realigned quadrature clock signals can be used to recover data from data D at 500 and to read and write data locally and transmit commands, addresses, and data. Data retimed by the recovered quadrature clock signals is transmitted to a succeeding downstream AMB, such as AMB 30b (shown in FIG. 1). Edge detector 130 provides leading and lagging indicators to low bandwidth integrator circuit 106, which slowly moves the quadrature clock signals, such that the rising edge of the first of the four quadrature clock signals I at 532 is more closely aligned with transitions at 510 in data D at 500.

Figure 8:
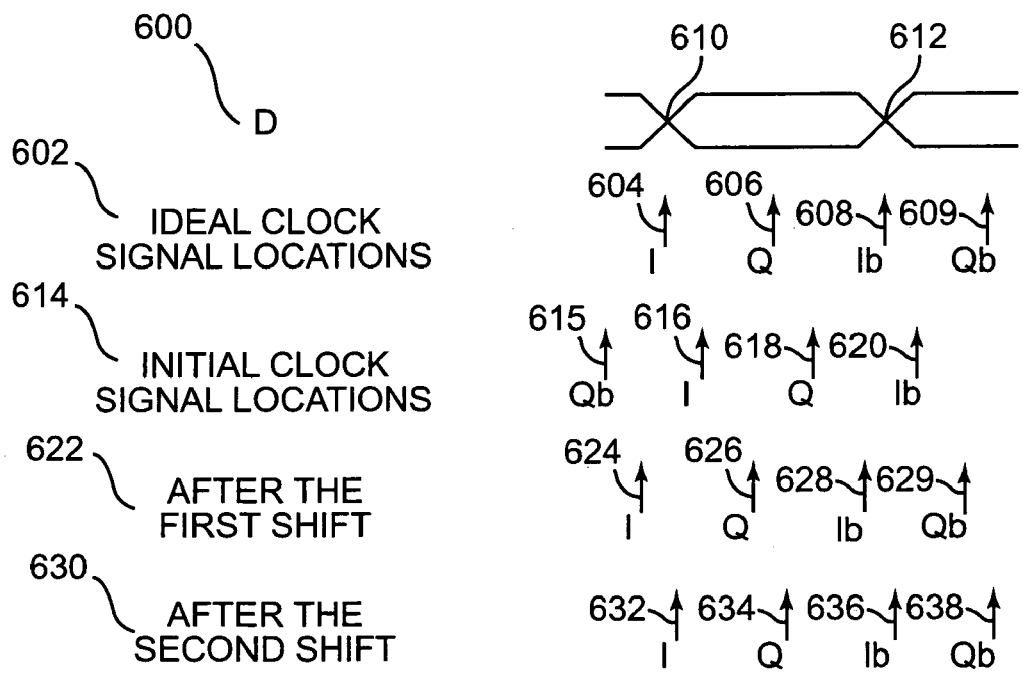
FIG. 8 is a diagram illustrating a fourth example operation of one embodiment of a CDR.

FIG. 8 is a diagram illustrating another example operation of one embodiment of CDR 48a. Data D at 600 is received by sampling circuits 128a-128d. The ideal clock signal locations at 602 indicate ideal locations for the rising edge of the first of the four quadrature clock signals I at 604, the rising edge of the second of the four quadrature clock signals Q at 606, the rising edge of the third of the four quadrature clock signals Ib at 608, and the rising edge of the fourth of the four quadrature clock signals Qb at 609. Ideally, the rising edge of the first of the four quadrature clock signals I at 604 is aligned with transitions at 610 in data D at 600, the rising edge of the second of the four quadrature clock signals Q at 606 is aligned with the middle of the eye of data D at 600, the rising edge of the third of the four quadrature clock signals Ib at 608 is aligned with transitions at 612 in data D at 600, and the rising edge of the fourth of the four quadrature clock signals Qb at 609 is aligned with the middle of the eye of data D at 600.

To begin, the initial clock signal locations at 614 indicate transitions at 610 in data D at 600 occur between the rising edge of the fourth of the four quadrature clock signals Qb at 615 and the rising edge of the first of the four quadrature clock signals I at 616. Transitions in data D at 600 do not occur between the rising edge of the first of the four quadrature clock signals I at 616 and the rising edge of the second of the four quadrature clock signals Q at 618. Also, transitions 612 in data D at 600 occur between the rising edge of the second of the four quadrature clock signals Q at 618 and the rising edge of the third of the four quadrature clock signals Ib at 620. The rising-edge of the first of the four quadrature clock signals I at 616 lags transitions at 610 in data D at 600 and edge detector 130 provides lagging indicators to lagging indicator accumulator 136 of high bandwidth integrator circuit 102.

After eight lagging indicators are accumulated, overflow detector 138 provides a high speed shift signal to FSM 146 via shift communications path 120. The high speed shift signal indicates that the rising edge of the first of the four quadrature clock signals I at 616 lags transitions at 610 in data D at 600. FSM 146 receives the high speed shift signal from overflow detector 138 and transmits a reset signal to hold high bandwidth integrator circuit 102 in reset. Holding leading indicator accumulator 134 and lagging indicator accumulator 136 in reset breaks the feedback circuit loop including detector circuit 100 to high bandwidth integrator circuit 102 to control circuit 104 and back to detector circuit 100. The received high speed shift signal is the first high speed shift signal after releasing electrical idle and PI 148 shifts the quadrature clock signals 45 degrees to the left.

The signals after the first shift at 622 indicate transitions at 610 in data D at 600 occur between the rising edge of the first of the four quadrature clock signals I at 624 and the rising edge of the second of the four quadrature clock signals Q at 626. Transitions in data D at 600 do not occur between the rising edge of the second of the four quadrature clock signals Q at 626 and the rising edge of the third of the four quadrature clock signals Ib at 628. Transitions at 612 in data D at 600 occur between the rising edge of the third of the four quadrature clock signals Ib at 628 and the rising edge of the fourth of the four quadrature clock signals Qb at 629. The rising edge of the first of the four quadrature clock signals I at 624 leads transitions at 610 in data D at 600 and edge detector 130 provides leading indicators to leading indicator accumulator 136 of high bandwidth integrator circuit 102.

After eight leading indicators are accumulated, overflow detector 138 provides a second high speed shift signal to FSM 146 via shift communications path 120. The second high speed shift signal indicates that the rising edge of the first of the four quadrature clock signals I at 624 leads transitions at 610 in data D at 600. FSM 146 receives the second high speed shift signal from overflow detector 138 and transmits a reset signal to hold high bandwidth integrator circuit 102 in reset. Holding leading indicator accumulator 134 and lagging indicator accumulator 136 in reset breaks the feedback circuit loop including detector circuit 100 to high bandwidth integrator circuit 102 to control circuit 104 and back to detector circuit 100. The high speed shift signal is the second high speed shift signal after releasing electrical idle and PI 148 shifts the quadrature clock signals 22.5 degrees to the right.

After the second shift at 630 the rising edge of the first of the quadrature clock signals I at 632 is locked within 22.5 degrees of transitions at 610 of data D at 600, the rising edge of the second of the quadrature clock signals Q at 634 is locked within 22.5 degrees of the middle of the eye of data D at 600, the rising edge of the third of the quadrature clock signals Ib at 636 is locked within 22.5 degrees of transitions at 612 of data D at 600, and the rising edge of the fourth of the quadrature clock signals Qb at 638 is locked within 22.5 degrees of the middle of the eye of data D at 600. The recovered or realigned quadrature clock signals can be used to recover data from data D at 600 and to read and write data locally and transmit commands, addresses, and data. Data retimed by the recovered quadrature clock signals is transmitted to a succeeding downstream AMB, such as AMB 30*b* (shown in FIG. 1). Edge detector 130 provides leading and lagging indicators to low bandwidth integrator circuit 106, which slowly moves the quadrature clock signals, such that the rising edge of the first of the four quadrature clock signals I at 632 is more closely aligned with transitions at 610 in data D at 600.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A clock data recovery circuit, comprising:
 a first circuit configured to receive data and a clock signal and to detect transitions in the data and provide a first signal based on the clock signal and the transitions in the data;
 a second circuit configured to receive the first signal and provide a first shift signal based on the first signal; and
 a third circuit configured to receive the first shift signal, wherein the first circuit, the second circuit, and the third circuit are configured to form a first circuit loop and the third circuit is configured to disable the first circuit loop based on the first shift signal and shift the clock signal based on the first shift signal.

2. The clock data recovery circuit of claim 1, wherein the first shift signal indicates successive approximation values and the third circuit is configured to shift the clock signal in successive approximation shifts based on the first shift signal.

3. The clock data recovery circuit of claim 1, wherein the first circuit is configured to provide the first signal and the first signal indicates time differences between the transitions in the data and transitions in the clock signal.

4. The clock data recovery circuit of claim 1, wherein the first circuit is configured to receive the data at a data rate and provide the first signal at the data rate.

5. The clock data recovery circuit of claim 1, comprising a fourth circuit wherein the first circuit, the fourth circuit, and the third circuit are configured to form a second circuit loop, wherein the first circuit provides a second signal and the fourth circuit is configured to receive the second signal and provide a second shift signal to the third circuit that is configured to shift the clock signal based on the second shift signal.

6. A clock data recovery circuit, comprising:
a detector circuit configured to receive data and clock signals and provide a first signal that indicates leading differences and lagging differences between transitions in the clock signals and transitions in the data;
an integrator circuit configured to receive the first signal and accumulate the leading differences and the lagging differences to provide a successive approximation signal; and
a phase shift circuit configured to receive the successive approximation signal and to shift the clock signals in response to the successive approximation signal, wherein the detector circuit, the integrator circuit, and the phase shift circuit are configured to form a circuit loop and the phase shift circuit is configured to disable the circuit loop to shift the clock signals and enable the circuit loop to receive another successive approximation signal.

7. The clock data recovery circuit of claim 6, wherein the clock signals received by the detector circuit include quadrature clock signals and the detector circuit is configured to detect transitions in the data within a phase difference of transitions in one of the quadrature clock signals.

8. The clock data recovery circuit of claim 7, wherein the phase shift circuit is configured to shift the clock signals approximately one half of the phase difference in response to a first successive approximation signal and to shift the clock signals approximately one fourth of the phase difference in response to a second successive approximation signal.

9. The clock data recovery circuit of claim 6, wherein the integrator circuit comprises:
a first accumulator configured to accumulate the leading differences; and
a second accumulator configured to accumulate the lagging differences, wherein the integrator circuit provides a shift right successive approximation signal in response to a first value in the first accumulator and a shift left successive approximation signal in response to a second value in the second accumulator.

10. A memory buffer circuit, comprising:
a clock data recovery circuit configured to receive data and recover a clock signal from the data, the clock data recovery circuit comprising:
a detector circuit configured to receive the data and the clock signal and to provide a first signal at a first rate, wherein the first signal indicates differences between transitions in the data and transitions in the clock signals;
a high bandwidth integrator circuit configured to receive the first signal at the first rate to accumulate the differences between transitions in the data and transitions in the clock signals and provide a first shift signal;
a control circuit configured to receive the first shift signal and reset the high bandwidth integrator circuit and to shift the phase of the clock signal in response to the first shift signal, wherein the phase of the clock is shifted in smaller increments for each successive first shift signal for a selected number of first shift signals.

11. The memory buffer circuit of claim 10, comprising:
a low bandwidth integrator circuit configured to receive a second signal at a second rate to accumulate differences between transitions in the data and transitions in the clock signals and provide a second shift signal, wherein the detector circuit is configured to provide the second signal at the second rate and the second signal indicates differences between transitions in the data and transitions in the clock signals and the control circuit is configured to receive the second shift signal and shift the clock signals to receive a revised second shift signal.

12. The memory buffer circuit of claim 10, wherein the control circuit comprises:
a finite state machine circuit configured to receive the first shift signal and reset and disable the high bandwidth integrator and to provide a phase shift signal; and
a phase interpolator configured to provide the clock signal and receive the phase shift signal to shift the clock signal in response to the phase shift signal.

13. A clock data recovery circuit comprising:
means for receiving data;
means for detecting differences between transitions in the data and transitions in a clock signal;
means for accumulating the differences to obtain a first shift signal;
means for disabling accumulation of the differences based on the first shift signal; and
means for phase shifting the clock signal in response to the first shift signal while the accumulation of the differences is disabled.

14. The clock data recovery circuit of claim 13, comprising:
means for accumulating the differences to obtain a second shift signal; and
means for phase shifting the clock signal in response to the second shift signal while the accumulation of the differences is enabled.

15. A method for clock data recovery, comprising:
providing a clock signal;
receiving data;
indicating differences between transitions in the data and transitions in the clock signal;
accumulating the differences in a first circuit;
indicating accumulated differences from the first circuit;
disabling acquisition of another indication of accumulated differences from the first circuit based on the indicated accumulated differences from the first circuit; and
shifting the clock signal based on the indicated accumulated differences from the first circuit while acquisition of another indication of the accumulated differences from the first circuit is disabled.

16. The method of claim 15, comprising:
enabling acquisition of another indication of the accumulated differences from the first circuit; and
providing the shifted clock signal to acquire another indication of the accumulated differences from the first circuit.

17. The method of claim 15, comprising:
shifting the clock signal in a successive approximation based on the acquired indication of the accumulated differences from the first circuit while acquisition of another indication of the accumulated differences from the first circuit is disabled.

18. The method of claim 15, wherein:
receiving data comprises receiving data at a data rate; and
indicating differences comprises indicating the differences at the data rate.

19. The method of claim 15, comprising:
accumulating the differences in a second circuit;
indicating accumulated differences from the second circuit; and
shifting the clock signal based on the indicated accumulated differences from the second circuit.

20. A method for clock data recovery, comprising:
providing clock signals;
receiving data;
indicating leading and lagging differences between transitions in the data and transitions in the clock signals;
accumulating the leading and lagging differences;
acquiring a first indication of accumulated differences;
disabling acquisition of a second indication of accumulated differences based on the first indication of accumulated differences;
shifting the clock signals based on the first indication of accumulated differences while acquisition of the second indication of the accumulated differences is disabled;
enabling acquisition of the second indication of accumulated differences;
shifting the clock signals based on the second indication of accumulated differences while acquisition of a third indication of the accumulated differences is disabled.

21. The method of claim 20, wherein:
providing clock signals comprises providing quadrature clock signals; and
indicating leading and lagging differences comprises detecting transitions in the data within approximately 90 degrees of transitions in one of the quadrature clock signals.

22. The method of claim 21, wherein:
shifting the clock signals based on the first indication comprises shifting the clock signals approximately 45 degrees; and
shifting the clock signals based on the second indication comprises shifting the clock signals approximately 22.5 degrees.

23. A method of clock data recovery in a memory buffer circuit, comprising:
providing a clock signal to a detector circuit;
receiving data at the detector circuit;
indicating leading and lagging differences between transitions in the data and transitions in the clock signal;
accumulating the leading and lagging differences at a high bandwidth integrator at a first rate;
indicating accumulated differences from the high bandwidth integrator;
receiving the indicated accumulated differences from the high bandwidth integrator at a control circuit;
resetting the high bandwidth integrator circuit;
shifting the clock signal while the high bandwidth integrator is reset in response to the indicated accumulated differences from the high bandwidth integrator; and
shifting the clock signal in decreasing increments in response to successive indicated accumulated differences from the high bandwidth integrator.

24. The method of claim 23, comprising:
accumulating the leading and lagging differences at a low bandwidth integrator at a second rate;
indicating accumulated differences from the low bandwidth integrator;
receiving the indicated accumulated differences from the low bandwidth integrator at the control circuit; and
shifting the clock signal in response to the indicated accumulated differences from the low bandwidth integrator.

25. The method of claim 23, comprising:
providing a phase shift signal from a finite state machine;
wherein receiving the indicated accumulated differences from the high bandwidth integrator comprises receiving the indicated accumulated differences from the high bandwidth integrator at the finite state machine circuit; and
resetting the high bandwidth integrator circuit comprises resetting the high bandwidth integrator circuit via the finite state machine.

26. The method of claim 25, comprising:
receiving the phase shift signal at a phase interpolator; and
providing the clock signal via the phase interpolator based on the phase shift signal.

* * * * *